United States Patent
Lee et al.

(10) Patent No.: US 11,834,597 B2
(45) Date of Patent: Dec. 5, 2023

(54) SEMICONDUCTOR NANOCRYSTAL PARTICLES, PRODUCTION METHODS THEREOF, AND DEVICES INCLUDING THE SAME

(71) Applicant: SAMSUNG ELECTRONICS CO., LTD., Suwon-si (KR)

(72) Inventors: Jeong Hee Lee, Seongnam-si (KR); Hyun A Kang, Suwon-si (KR); Sung Woo Kim, Hwaseong-si (KR); Jin A Kim, Suwon-si (KR); Tae Hyung Kim, Seoul (KR); Yuho Won, Seoul (KR); Eun Joo Jang, Suwon-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 17/532,439

(22) Filed: Nov. 22, 2021

(65) Prior Publication Data
US 2022/0081614 A1    Mar. 17, 2022

Related U.S. Application Data

(63) Continuation of application No. 16/851,625, filed on Apr. 17, 2020, now Pat. No. 11,180,694, which is a (Continued)

(30) Foreign Application Priority Data

Oct. 25, 2017  (KR) .................. 10-2017-0139603

(51) Int. Cl.
*H10K 50/115* (2023.01)
*C09K 11/88* (2006.01)
(Continued)

(52) U.S. Cl.
CPC .......... *C09K 11/883* (2013.01); *C01B 19/007* (2013.01); *C09K 11/02* (2013.01);
(Continued)

(58) Field of Classification Search
CPC ............................ H01L 51/502; C09K 11/02
See application file for complete search history.

(56) References Cited

U.S. PATENT DOCUMENTS

| 7,767,260 B2 | 8/2010 | Peng et al. |
| 8,377,333 B2 | 2/2013 | Ramprasad |

(Continued)

FOREIGN PATENT DOCUMENTS

| KR | 1020140143875 A | 12/2014 |
| KR | 1525524 B1 | 6/2015 |

(Continued)

OTHER PUBLICATIONS

Notice of Allowance dated Feb. 14, 2022 of the corresponding Korean Patent Application No. 10-2017-0139603.
(Continued)

*Primary Examiner* — Douglas M Menz
(74) *Attorney, Agent, or Firm* — CANTOR COLBURN LLP

(57) ABSTRACT

A method of producing a quantum dot comprising zinc selenide, the method comprising: providing an organic ligand mixture comprising a carboxylic acid compound, a primary amine compound, a secondary amide compound represented by Chemical Formula 1, and a first organic solvent:

RCONHR                                            Chemical Formula 1 wherein each R is as defined herein;
heating the organic ligand mixture in an inert atmosphere at a first temperature to obtain a heated organic ligand mixture;

(Continued)

adding a zinc precursor, a selenium precursor, and optionally a tellurium precursor to the heated organic ligand mixture to obtain a reaction mixture, wherein the zinc precursor does not comprise oxygen; and heating the reaction mixture at a first reaction temperature to synthesize a first semiconductor nanocrystal particle.

19 Claims, 13 Drawing Sheets

Related U.S. Application Data continuation of application No. 16/170,493, filed on Oct. 25, 2018, now Pat. No. 10,647,917.

(51) Int. Cl.
*C09K 11/02* (2006.01)
*C01B 19/00* (2006.01)
*B82Y 20/00* (2011.01)
*B82Y 40/00* (2011.01)
*B82Y 30/00* (2011.01)

(52) U.S. Cl.
CPC .............. *B82Y 20/00* (2013.01); *B82Y 30/00* (2013.01); *B82Y 40/00* (2013.01); *C01P 2004/64* (2013.01); *H10K 50/115* (2023.02)

(56) References Cited

U.S. PATENT DOCUMENTS

| | | | |
|---|---|---|---|
| 8,420,155 B2 | 4/2013 | Nie et al. | |
| 8,901,333 B2 | 12/2014 | Tulsky et al. | |
| 8,906,265 B2 | 12/2014 | Breen et al. | |
| 9,284,484 B2 | 3/2016 | Jang et al. | |
| 9,534,168 B2 | 1/2017 | Breen et al. | |
| 9,570,549 B2 | 2/2017 | Jang et al. | |
| 9,595,625 B2 | 3/2017 | Murayama et al. | |
| 9,834,724 B2 | 12/2017 | Kim et al. | |
| 10,147,844 B2 | 12/2018 | Kim et al. | |
| 10,647,917 B2 | 5/2020 | Lee et al. | |
| 11,011,720 B2 | 5/2021 | Kim et al. | |
| 11,193,061 B2 | 12/2021 | Kim et al. | |
| 11,319,487 B2 * | 5/2022 | Lee ........................ C09K 11/02 |
| 11,512,252 B2 | 11/2022 | Park et al. | |
| 2005/0214536 A1 | 9/2005 | Schrier et al. | |
| 2010/0044635 A1 | 2/2010 | Breen et al. | |
| 2011/0175054 A1 | 7/2011 | Ren et al. | |
| 2013/0069018 A1 | 3/2013 | Zhu et al. | |
| 2014/0227862 A1 | 8/2014 | Song et al. | |
| 2014/0339497 A1 | 11/2014 | Qu et al. | |
| 2014/0361228 A1 | 12/2014 | Jang et al. | |
| 2016/0225947 A1 | 8/2016 | Murayama et al. | |
| 2016/0225958 A1 | 8/2016 | Kazama et al. | |
| 2017/0088775 A1 | 3/2017 | Park et al. | |
| 2017/0152436 A1 | 6/2017 | Jang et al. | |
| 2018/0094190 A1 | 4/2018 | Kim et al. | |
| 2023/0086635 A1 | 3/2023 | Park et al. | |

FOREIGN PATENT DOCUMENTS

| | | | |
|---|---|---|---|
| KR | 1699540 B1 | 1/2017 |
| KR | 20170036557 A | 4/2017 |
| KR | 1020170078928 A | 7/2017 |
| WO | 2005001889 A1 | 1/2005 |
| WO | 2008063652 A1 | 5/2008 |
| WO | 2015056749 A1 | 4/2015 |

OTHER PUBLICATIONS

Extended European Search Report dated Oct. 2, 2018, of the corresponding European Patent Application No. 18171712.5.

Final OA dated Dec. 16, 2020 in U.S. Appl. No. 15/976,197.

Li, C. et al., "Synthesis of Cd-free water-soluble $ZnSe_{1-x}Te_x$ nanocrystals with high luminescence in the blue region", Journal of Colloid and Interface Science, Feb. 14, 2008, pp. 468-476, vol. 321, No. 2, ScienceDirect.

Non-Final Office Action dated Jun. 25, 2020 in U.S. Appl. No. 15/976,197.

Non-Final Office Action, dated Jan. 30, 2023 of U.S. Appl. No. 17/709,830.

English Translation of Office Action dated Feb. 1, 2023 of the corresponding Korean Patent Application No. 10-2018-0053707, 10 pp.

K G Sonawance et al. "A case study: Te in ZnSe and Mn-doped ZnSe quantum dots". Nanotechnology 22, Jun. 27, 2011, pp. 1-7.

Office Action dated Feb. 1, 2023 of the corresponding Korean Patent Application No. 10-2018-0053707, 8 pp.

Notice of Allowance dated Sep. 26, 2023 of the corresponding Korean Patent Application No. 10-2018-0053707.

* cited by examiner

Core/shell

Pod type structure

SEMICONDUCTOR NANOCRYSTAL PARTICLES, PRODUCTION METHODS THEREOF, AND DEVICES INCLUDING THE SAME

CROSS-REFERENCE TO RELATED APPLICATION

This application is a continuation of U.S. application Ser. No. 16/851,625, filed on Apr. 17, 2020, which is a continuation of U.S. application Ser. No. 16/170,493, filed Oct. 19, 2018, which claims priority to and the benefit of Korean Patent Application No. 10-2017-0139603 filed in the Korean Intellectual Property Office on Oct. 25, 2017, and all the benefits accruing therefrom under 35 U.S.C. § 119, the entire contents of which are incorporated herein by reference.

BACKGROUND

1. Field

A semiconductor nanocrystal particle, a production method thereof, and a device including the same are disclosed.

2. Description of the Related Art

Unlike bulk materials, intrinsic physical characteristics (e.g., energy bandgaps and melting points) of nanoparticles may be controlled by changing the nanoparticle sizes. For example, a semiconductor nanocrystal particle (also known as a quantum dot) is a crystalline material having a particle size of several nanometers. The semiconductor nanocrystal particle has a small particle size that provides a large surface area per unit volume and exhibits a quantum confinement effect, and thus may have different properties than bulk materials having the same composition. A quantum dot may absorb light from an excitation source to be excited, and may emit energy corresponding to its energy bandgap.

SUMMARY

An embodiment provides a cadmium-free semiconductor nanocrystal particle capable of emitting light of a desired wavelength with an enhanced efficiency and a narrowed full width at half maximum (FWHM) and a production method thereof.

An embodiment provides an electronic device including the semiconductor nanocrystal particle.

In an embodiment, a method of producing a quantum dot including zinc selenide (ZnSe) is provided, the method including:

providing an organic ligand mixture including a carboxylic acid compound, a primary amine compound, a secondary amide compound represented by Chemical Formula 1, and a first organic solvent:

$$RCONHR \qquad \text{Chemical Formula 1}$$

wherein each R is the same or different and each independently is a substituted or unsubstituted aliphatic hydrocarbon having a carbon number of greater than or equal to 5, a substituted or unsubstituted alicyclic hydrocarbon having a carbon number of greater than or equal to 3, or a substituted or unsubstituted aromatic hydrocarbon having a carbon number of greater than or equal to 6;

heating the organic ligand mixture in an inert atmosphere at a first temperature to obtain a heated organic ligand mixture;

adding a zinc precursor, a selenium precursor, and optionally a tellurium precursor to the heated organic ligand mixture to obtain a reaction mixture, wherein the zinc precursor does not include oxygen (e.g., a zinc-oxygen bond); and heating the reaction mixture at a first reaction temperature to synthesize a first semiconductor nanocrystal particle.

The carboxylic acid compound may include a compound represented by Chemical Formula 2, and/or the primary amine compound may include a compound represented by Chemical Formula 3:

$$R^1COOH \qquad \text{Chemical Formula 2}$$

$$R^2NH_2 \qquad \text{Chemical Formula 3}$$

wherein $R^1$ and $R^2$ are the same or different and each independently is a substituted or unsubstituted aliphatic hydrocarbon having a carbon number of greater than or equal to 5, a substituted or unsubstituted alicyclic hydrocarbon having a carbon number of greater than or equal to 3, a substituted or unsubstituted aromatic hydrocarbon having a carbon number of greater than or equal to 6, or a combination thereof;

The carboxylic acid compound may include pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, hexadecanoic acid, heptadecanoic acid, octadecanoic acid, nonadecanoic acid, eicosanoic acid, heneicosanoic acid, docosanoic acid, tricosanoic acid, tetracosanoic acid, pentacosanoic acid, hexacosanoic acid, heptacosanoic acid, octacosanoic acid, nonacosanoic acid, triacontanoic acid, tetra-triacontanoic acid, pentatriacontanoic acid, hexatriacontanoic acid, alpha linolenic acid, eicosapentaenoic acid, docosahexaenoic acid, linolenic acid, gamma-linolenic acid, dihomo-gamma-linolenic acid, arachidonic acid, paullinic acid, oleic acid, elaidic acid, eicosenoic acid, erucic acid, nervonic acid, or a combination thereof.

The primary amine compound may include a pentylamine, hexylamine, heptylamine, octylamine, nonylamine, decylamine, undecylamine, dodecylamine, tridecylamine, pentadecylamine, hexadecylamine, heptadecylamine, ocatdecylamine, nonadecylamine, oleylamine, or a combination thereof.

The secondary amide compound may include two different aliphatic hydrocarbon groups each independently having a carbon number of 10 to 40.

The providing of the organic ligand mixture may include heating the carboxylic acid compound and the primary amine compound in the organic solvent at a temperature of greater than or equal to about 200° C. for about 10 minutes or longer.

An amount of the primary amine compound (e.g., in the organic ligand mixture) may be greater than or equal to about 0.5 moles with respect to 1 mole of the carboxylic acid compound.

An amount of the primary amine compound (e.g., in the organic ligand mixture) may be less than or equal to about 3 moles with respect to 1 mole of the carboxylic acid compound.

An amount of the primary amine compound (e.g., in the organic ligand mixture) may be less than or equal to about 2 moles with respect to 1 mole of the carboxylic acid compound.

An amount of the primary amine compound (e.g., in the organic ligand mixture) may be less than or equal to about 1 moles with respect to 1 mole of the carboxylic acid compound.

An amount of the carboxylic acid compound in the reaction mixture may be greater than or equal to about 0.1 moles and less than or equal to about 10 moles based on 1 mole of the zinc precursor.

An amount of the primary amine compound (e.g., in the reaction mixture) may be greater than or equal to about 0.1 moles and less than or equal to about 10 moles based on 1 mole of the zinc precursor.

An amount of the secondary amide compound (e.g., in the reaction mixture) may be greater than or equal to about 0.1 moles and less than or equal to about 10 moles based on 1 mole of the zinc precursor.

The first organic solvent may include a secondary amine having at least one C6 to C40 aliphatic hydrocarbon (e.g., alkyl or alkenyl) group (e.g., a C12 to C40 secondary amine compound), a tertiary amine having at least one C6 to C40 aliphatic hydrocarbon (e.g., alkyl or alkenyl) group (e.g., a C18 to C60 tertiary amine compound), a nitrogen-containing heterocyclic compound, a C6 to C50 aliphatic hydrocarbon, a C6 to C60 aromatic hydrocarbon, a phosphine compound having at least one C6 to C22 alkyl group (e.g., a C6 to C60 phosphine compound), a phosphine oxide having at least one C6 to C22 aliphatic hydrocarbon (e.g., alkyl or alkenyl) group (e.g., a C6 to C60 phosphine oxide), a C12 to C22 aromatic ether, or a combination thereof.

The first temperature may be greater than or equal to about 240° C. and less than or equal to about the first reaction temperature.

The zinc precursor may include a zinc powder, an alkylated zinc compound, a zinc halide, a zinc cyanide, or a combination thereof.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof.

The tellurium precursor may include tellurium-trioctylphosphine (Te-TOP), tellurium-tributylphosphine (Te-TBP), tellurium-triphenylphosphine (Te-TPP), tellurium-diphenylphosphine (Te-DPP), or a combination thereof.

The first reaction temperature may be greater than or equal to about 270° C.

The first reaction temperature may be less than or equal to about 350° C.

The first semiconductor nanocrystal particle may include $ZnSe_{1-x}Te_x$ (wherein, x is greater than about 0 and less than or equal to about 0.2).

A size of the first semiconductor nanocrystal particle may be greater than or equal to about 2 nanometers.

A size of the first semiconductor nanocrystal particle may be less than or equal to about 5 nanometers.

The method may further include providing a first shell precursor solution including a metal-containing first shell precursor, an organic ligand, and a second organic solvent;

providing a second shell precursor including a non-metal element; and heating the first shell precursor solution at a second reaction temperature and adding the first semiconductor nanocrystal particle and the second shell precursor thereto to form a shell including a second semiconductor nanocrystal on the first semiconductor nanocrystal particle.

The metal-containing first shell precursor may include zinc, and the second shell precursor may include selenium, sulfur, or a combination thereof.

The organic ligand may include $RCOOH$, $RNH_2$, $R_2NH$, $R_3N$, $RSH$, $RH_2PO$, $R_2HPO$, $R_3PO$, $RH_2P$, $R_2HP$, $R_3P$, $ROH$, $RCOOR$, $RPO(OH)_2$, $RHPOOH$, $R_2POOH$, or a combination thereof, wherein R is the same or different and independently is a C1 to C40 substituted or unsubstituted aliphatic hydrocarbon group, a C6 to C40 substituted or unsubstituted aromatic hydrocarbon group, or a combination thereof.

The second organic solvent may include a primary amine having a C6 to C40 (aliphatic) hydrocarbon (e.g., alkyl or alkenyl) group (e.g., a C6 to C40 primary amine compound), a secondary amine having at least one C6 to C40 (aliphatic) hydrocarbon (e.g., alkyl or alkenyl) group (e.g., a C6 to C40 secondary amine compound), a tertiary amine having at least one C6 to C40 (aliphatic) hydrocarbon (e.g., alkyl or alkenyl) group (e.g., a C6 to C40 tertiary amine compound), a nitrogen-containing heterocyclic compound, a C6 to C50 aliphatic hydrocarbon, a C6 to C50 aromatic hydrocarbon, a phosphine compound having at least one C6 to C22 (aliphatic) hydrocarbon (e.g., alkyl or alkenyl) group (e.g., a C6 to C60 phosphine compound), a phosphine oxide compound having at least one C6 to C22 (aliphatic) hydrocarbon (e.g., alkyl or alkenyl) group (e.g., a C6 to C60 phosphine oxide compound), a C12 to C22 aromatic ether, or a combination thereof.

In another embodiment, a quantum dot includes a core including a first semiconductor nanocrystal material including zinc, tellurium, and selenium; and a shell disposed on at least a portion of the core and including a second semiconductor nanocrystal material different from the first semiconductor nanocrystal material, wherein the quantum dot does not include cadmium, wherein the quantum dot has a maximum photoluminescent emission peak in a wavelength range of greater than or equal to about 440 nanometers (nm) and less than or equal to about 540 nm, and wherein the quantum dot has a quantum efficiency of greater than or equal to about 60%.

The first semiconductor nanocrystal material may include $ZnSe_{1-x}Te_x$ (wherein, x is greater than about 0 and less than or equal to about 0.2).

The second semiconductor nanocrystal material may include ZnSeS.

The shell has a gradient composition varying in a radial direction from the core.

The quantum dot has a maximum photoluminescent emission peak having a full width at half maximum (FWHM) of less than or equal to about 40 nm.

The quantum dot may have a multi-pod shape.

The quantum dot may have quantum efficiency of greater than or equal to about 70%.

The quantum dot may have quantum efficiency of greater than or equal to about 80%.

The quantum dot may have a particle size of greater than or equal to about 3 nm.

The semiconductor nanocrystal particle may have a particle size of less than or equal to about 30 nm.

The semiconductor nanocrystal particle may not include cadmium.

In an embodiment, an electronic device includes the aforementioned quantum dot.

The electronic device may be a display device, a light emitting diode (LED), a quantum dot light emitting diode (QLED), an organic light emitting diode (OLED), a sensor, an image sensor, or a solar cell.

A cadmium-free semiconductor nanocrystal particle capable of emitting light of a desired wavelength (e.g., blue light) with an improved efficiency and a narrowed FWHM may be provided. The semiconductor nanocrystal particle may be applied to various display devices, biolabeling (biosensor, bioimaging), a photodetector, a solar cell, a hybrid composite, or the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
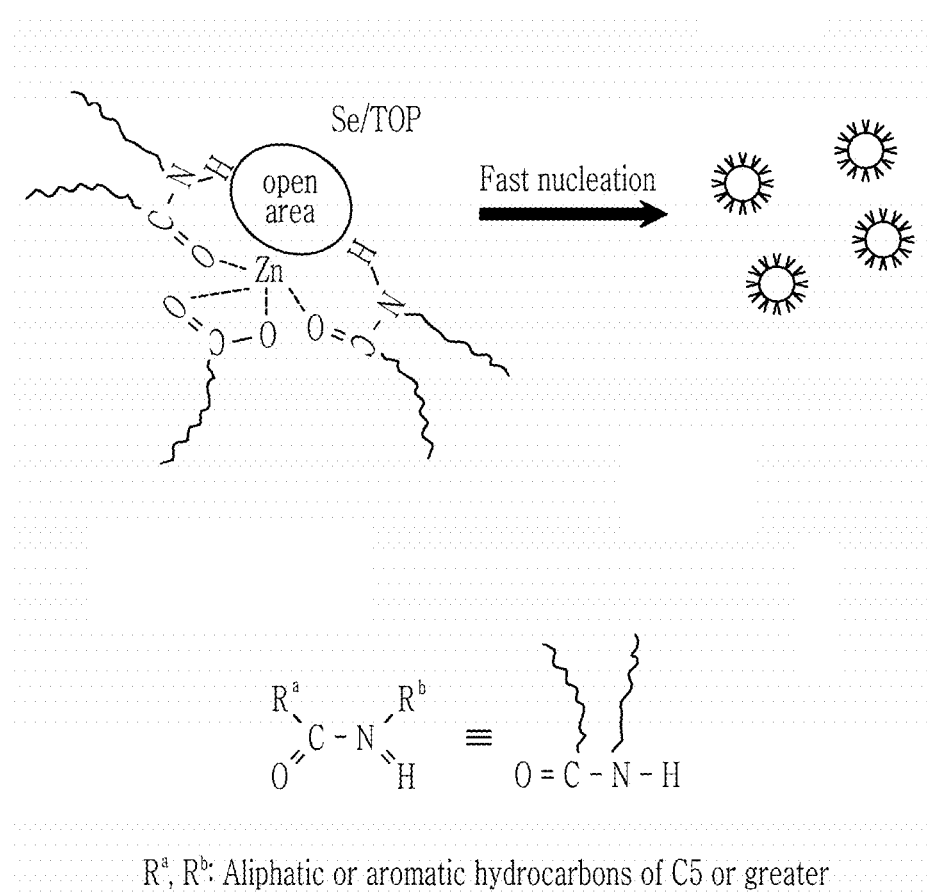
FIG. 1 is a schematic view illustrating a part of a process for forming a particle via using a ligand mixture in a production method of a semiconductor nanocrystal particle according to a non-limiting embodiment.

Advantages and characteristics of this disclosure, and a method for achieving the same, will become evident referring to the following example embodiments together with the drawings attached hereto. However, the embodiments should not be construed as being limited to the embodiments set forth herein. Unless otherwise defined, all terms used in the specification (including technical and scientific terms) may be used with meanings commonly understood by a person having ordinary knowledge in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." It will be further understood that the terms "comprises" and/or "comprising," or "includes" and/or "including" when used in this specification, specify the presence of stated features, regions, integers, steps, operations, elements, and/ or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to a compound or a moiety wherein at least one of the hydrogen atoms thereof is replaced by a substituent, provided that the substituted atom's normal valence is not exceeded, wherein the substituent may be a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$)), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, a "hydrocarbon group" refers to a group including carbon and hydrogen (e.g., an alkyl, alkenyl, alkynyl, or aryl group). The hydrocarbon group may be a group having a monovalency or greater, for example a monovalent, divalent, or tetravalent group, formed by removal of one or more hydrogen atoms from, for example, an aliphatic or aromatic hydrocarbon such as alkane, alkene, alkyne, or arene. In the hydrocarbon group, at least one methylene (—CH$_2$—) moiety may be replaced by an oxide moiety (—O—), a carbonyl moiety (—C=O—), an ester moiety (—COOR wherein R is an alkyl, alkenyl, alkynyl, or aryl group), an amino moiety (—NH—), or a combination thereof. Alternatively, the hydrocarbon group may consist of carbon and hydrogen.

As used herein, "aliphatic" refers to a saturated or unsaturated linear or branched hydrocarbon group having at least one carbon atoms (for example, 5 to 40 carbon atoms, for example 6 to 24 carbon atoms). An aliphatic group may be an alkyl, alkenyl, or alkynyl group, for example.

As used herein, "alicyclic" refers to a cyclic hydrocarbon having properties of an aliphatic group. The alicyclic group may be a C5 to C40 cycloalkyl group, a C5 to C40 cycloalkenyl group, or a C5 to C40 cycloalkynyl group.

As used herein, "alkyl" refers to a linear or branched saturated monovalent hydrocarbon group (e.g., methyl, ethyl, hexyl, or the like).

As used herein, "alkenyl" refers to a linear or branched monovalent hydrocarbon group having one or more carbon-carbon double bond.

As used herein, "alkynyl" refers to a linear or branched monovalent hydrocarbon group having one or more carbon-carbon triple bond.

As used herein, "aryl" is an aromatic hydrocarbon and refers to a cyclic moiety including carbon atoms in which at least one ring is aromatic, the moiety having the specified number of carbon atoms, specifically 6 to 40 carbon atoms, more specifically 6 to 24 carbon atoms. More than one ring may be present, and any additional rings may be independently aromatic, saturated or partially unsaturated, and may be fused, pendant, spirocyclic or a combination thereof. The term "aryl" may include a heteroaryl group including at least one heteroatom. Alternatively, in the aryl group, all ring members may be carbon. Exemplary aromatic hydrocarbon groups include phenyl, naphthyl, benzyl, or the like.

As used herein, "cycloalkyl" refers to a group that comprises one or more saturated and/or partially saturated rings in which all ring members are carbon, such as cyclopropyl, cyclobutyl, cyclopentyl, cyclohexyl, cycloheptyl, cyclooctyl, adamantyl and partially saturated variants of the foregoing, such as cycloalkenyl groups (e.g., cyclohexenyl) or cycloalkynyl groups. Cycloalkyl groups do not include an aromatic ring or a heterocyclic ring. When the numbers of carbon atoms is specified (e.g., C3 to C15 cycloalkyl), the number means the number of ring members present in the one or more rings.

As used herein, when a definition is not otherwise provided, the term "hetero" refers to inclusion of one or more (e.g., 1 to 3) heteroatoms that can be N, O, S, Si, P, or a combination thereof.

As used herein, an "amine" group may have a general formula NRR, wherein each R is independently hydrogen, an alkyl group, or an aryl group, but is not limited thereto. "Primary amine" may be an amine having the formula RNH$_2$, wherein R is hydrogen, an alkyl group, or an aryl group, but is not limited thereto. "Secondary amine" may be an amine having the formula RR'NH, wherein R and R' are each independently an alkyl group, an aryl group, or the like, but is not limited thereto. "Tertiary amine" may be an amine having the formula RR'R"N, wherein R, R', and R" are each independently an alkyl group, an aryl group, or the like, but is not limited thereto. "Amino" has the general formula —N(R)$_2$, wherein each R is independently hydrogen, a C1 to C6 alkyl, or a C6 to C12 aryl.

As used herein, "heterocyclic" refers to a cyclic group comprising at least one ring member that is a heteroatom. If multiple rings are present, each ring is independently aromatic, saturated or partially unsaturated and multiple rings, if present, may be fused, pendant, spirocyclic or a combination thereof. Heterocycloalkyl groups comprise at least one non-aromatic ring that contains a heteroatom ring member. Heteroaryl groups comprise at least one aromatic ring that contains a heteroatom ring member. Non-aromatic and/or carbocyclic rings may also be present in a heteroaryl group, provided that at least one ring is both aromatic and contains a ring member that is a heteroatom.

As used herein, "phosphine" has the general formula P(R)$_3$, wherein each R is independently hydrogen, an aliphatic group (e.g., alkyl or alkenyl) group, or an aromatic group.

As used herein, "phosphine oxide" has the general formula PO(R)3, wherein each R is independently hydrogen, an aliphatic group (e.g., alkyl or alkenyl) or an aromatic group.

As used herein, "Group" refers to a group of Periodic Table.

As used herein, the term "quantum yield" (QY) or the term "quantum efficiency (QE) is a value determined from a photoluminescence (PL) spectrum obtained by dispersing quantum dots in an appropriate solvent (e.g., toluene or hexane), and may be calculated with respect to the photoluminescent peak of an organic solution of a reference dye (e.g., an ethanol solution of an appropriate dye having an appropriate absorption (optical density) at a predetermined wavelength). As used herein, the term "quantum yield (QY)" and the term "quantum efficiency (QE)" may have substantially the same meaning and can be used interchangeably.

Semiconductor nanocrystal particles (hereinafter, also referred to as a quantum dot) may absorb light from an excitation source and may emit light corresponding to an energy bandgap thereof. The energy bandgap of the quantum dot may be changed depending on a particle size and a composition thereof. For example, as the particle size of the quantum dot increases, the quantum dot may have a narrower energy bandgap and may show an increased light emitting wavelength. Semiconductor nanocrystals have drawn attention as a light emitting material in various fields such as a display device, an energy device, or a bio light emitting device.

Most of quantum dots having a satisfactory level of a photoluminescence property for application include cadmium (Cd). The cadmium may raise severe environmental and/or health issues and is a restricted element defined under Restriction of Hazardous Substances Directive (RoHS) in a plurality of countries. Accordingly, there remain needs for development of a cadmium-free quantum dot having improved photoluminescence characteristics. In order to be applied to a QLED display device, a quantum dot having a relatively narrow full width at half maximum (FWHM) and capable of emitting light of a desired wavelength (e.g., a pure blue at PL peak around 455 nm or a green light at PL peak around 530 nm) may be desired. For example, a material capable of emitting light with a narrower FWHM and an enhanced efficiency may be required for a display device having a relatively high color reproducibility under a next generation color standard such as BT2020. Synthesis of a cadmium-free quantum dot having desirable photoluminescence properties and the aforementioned PL peak is not easy or has not been reported yet. A core-shell structure may improve photoluminescence properties of quantum dots, but most of conventional core-shell quantum dots having desirable properties include cadmium. Provided herein are cadmium-free semiconductor nanocrystal particles having desirable photoluminescence properties.

An embodiment is a method of producing a semiconductor nanocrystal particle including zinc selenide (ZnSe). As used herein, the term "zinc selenide" (ZnSe) refers to a type of a metal chalcogenide including at least zinc and selenium. The zinc selenide may further include additional elements such as tellurium. The method includes:

providing an organic ligand mixture including a carboxylic acid compound, a primary amine compound, a secondary amide compound represented by Chemical Formula 1, and an organic solvent:

RCONHR                   Chemical Formula 1 wherein each R is the same or different and each independently is a substituted or unsubstituted aliphatic hydrocarbon having a carbon number of greater than or equal to 5 (e.g., greater than or equal to 6, for example, greater than or equal to 7, greater than or equal to 8, greater than or equal to 9, greater than or equal to 10, greater than or equal to 11, greater than or equal to 12, greater than or equal to 13, greater than or equal to 14, greater than or equal to 15, greater than or equal to 16, greater than or equal to 17, greater than or equal to 18, or greater than or equal to 19) and less than or equal to 40 (e.g., less than or equal to 30, or less than or equal to 24), a substituted or unsubstituted alicyclic hydrocarbon having a carbon number of greater than or equal to 3 (e.g., greater than or equal to 6, for example, greater than or equal to 7, greater than or equal to 8, greater than or equal to 9, greater than or equal to 10, greater than or equal to 11, greater than or equal to 12, greater than or equal to 13, greater than or equal to 14, greater than or equal to 15, greater than or equal to 16, greater than or equal to 17, greater than or equal to 18, or greater than or equal to 19) and less than or equal to 40 (e.g., less than or equal to 30, or less than or equal to 24), or a substituted or unsubstituted aromatic hydrocarbon having a carbon number of greater than or equal to 6 (e.g., greater than or equal to 7, for example, greater than or equal to 8, greater than or equal to 9, greater than or equal to 10, greater than or equal to 11, greater than or equal to 12, greater than or equal to 13, greater than or equal to 14, greater than or equal to 15, greater than or equal to 16, greater than or equal to 17, greater than or equal to 18, or greater than or equal to 19) and less than or equal to 40 (e.g., less than or equal to 30, or less than or equal to 24), or a combination thereof;

heating the organic ligand mixture in an inert atmosphere at a first temperature;

adding a zinc precursor, a selenium precursor, and optionally a tellurium precursor to the heated organic ligand mixture to obtain a reaction mixture, wherein the zinc precursor does not include oxygen; and heating the reaction mixture at a first reaction temperature to synthesize a first semiconductor nanocrystal particle (hereinafter, also referred to as a core particle).

The zinc precursor may not include a zinc-oxygen bond.

The carboxylic acid compound may include a compound represented by Chemical Formula 2, and the primary amine compound may include a compound represented by Chemical Formula 3:

$R^1COOH$                 Chemical Formula 2

$R^2NH_2$                 Chemical Formula 3 wherein $R^1$ and $R^2$ are the same or different and are each independently a substituted or unsubstituted aliphatic hydrocarbon (e.g., a straight or branched alkyl, alkenyl, or alkynyl) having a carbon number of greater than or equal to 5 (e.g., greater than or equal to 6, for example, greater than or equal to 7, greater than or equal to 8, greater than or equal to 9, greater than or equal to 10, greater than or equal to 11, greater than or equal to 12, greater than or equal to 13, greater than or equal to 14, greater than or equal to 15, greater than or equal to 16, greater than or equal to 17, greater than or equal to 18, or greater than or equal to 19, or for example C5 to C40, or C6 to C24), a substituted or unsubstituted alicyclic hydrocarbon (e.g., cyclohexyl, cyclodecyl, tricyclodecyl, norbonyl, or the like) having a carbon number of greater than or equal to 3 (e.g., greater than or equal to 6, for example, greater than or equal to 7, greater than or equal to 8, greater than or equal to 9, greater than or equal to 10, greater than or equal to 11, greater than or equal to 12, greater than or equal to 13, greater than or equal to 14, greater than or equal to 15, greater than or equal to 16, greater than or equal to 17, greater than or equal to 18, or greater than or equal to 19, or for example C5 to C40, or C6 to C24), a substituted or unsubstituted aromatic hydrocarbon (e.g., aryl such as phenyl, naphthyl, or benzyl, or the like) having a carbon number of greater than or equal to 6 (e.g., greater than or equal to 6, for example, greater than or equal to 7, greater than or equal to 8, greater than or equal to 9, greater than or equal to 10, greater than or equal to 11, greater than or equal to 12, greater than or equal to 13, greater than or equal to 14, greater than or equal to 15, greater than or equal to 16, greater than or equal to 17, greater than or equal to 18, or greater than or equal to 19, or for example C6 to C40, or C6 to C24), or a combination thereof;

The carboxylic acid compound may include pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, hexadecanoic acid, heptadecanoic acid, octadecanoic acid, nonadecanoic acid, eicosanoic acid, heneicosanoic acid, docosanoic acid, tricosanoic acid, tetracosanoic acid, pentacosanoic acid, hexacosanoic acid, heptacosanoic acid, octacosanoic acid, nonacosanoic acid, triacontanoic acid, tetra-triacontanoic acid, pentatriacontanoic acid, hexatriacontanoic acid, alpha linolenic acid, eicosapentaenoic acid, docosahexaenoic acid, linolenic acid, gamma-linolenic acid, dihomo-gamma-linolenic acid, arachidonic acid, paullinic acid, oleic acid, elaidic acid, eicosenoic acid, erucic acid, nervonic acid, or a combination thereof.

The primary amine compound may include a pentylamine, hexylamine, heptylamine, octylamine, nonylamine, decylamine, undecylamine, dodecylamine, tridecylamine, pentadecylamine, hexadecylamine, heptadecylamine, ocatdecylamine, nonadecylamine, oleylamine, or a combination thereof.

The secondary amide compound may include the same or different two aliphatic hydrocarbon groups. A carbon number of the aliphatic hydrocarbon group may be greater than or equal to 7, for example, greater than or equal to 8, greater than or equal to 9, greater than or equal to 10, greater than or equal to 11, greater than or equal to 12, greater than or equal to 13, greater than or equal to 14, greater than or equal to 15, greater than or equal to 16, greater than or equal to 17, greater than or equal to 18, or greater than or equal to 19. A carbon number of the aliphatic hydrocarbon group may be less than or equal to 40, less than or equal to 39, less than or equal to 38, less than or equal to 37, less than or equal to 36, less than or equal to 35, less than or equal to 34, less than or equal to 33, less than or equal to 32, less than or equal to 31, less than or equal to 30, less than or equal to 29, less than or equal to 28, less than or equal to 27, less than or equal to 26, or less than or equal to 25. The secondary amide compound may have two different aliphatic hydrocarbon groups. In some embodiments, the aliphatic hydrocarbon group of the secondary amide compound may include a branched or linear long chain alkyl, a branched or linear long chain alkenyl, a branched or linear long chain alkynyl, or a combination thereof. As used herein, "long chain" refers to a carbon number of greater than or equal to 5, for example, at least 6, or at least 7.

A display device including a quantum dot based light emitting element is expected to realize an improved brightness and an enhanced color reproducibility. To this end, the quantum dot included in the element may be required to have an increased efficiency and a narrow FWHM. For example, it may be desired that the quantum dots may emit light of a wavelength between about 450 nanometers (nm) and about 460 nm or between about 520 and about 540 nm at a quantum efficiency of greater than or equal to about 80% and with a FWHM of less than or equal to about 40 nm. However, it is difficult or has not been reported yet to produce a quantum dot satisfying the foregoing desired conditions, for example, at an increased production yield.

According to the production method of the embodiments, a core particle is prepared in the presence of the aforementioned organic ligands, and the core particle thus prepared may have a relatively uniform shape (e.g., a sphere) and a relatively uniform particle size distribution. Present inventors have found that a quantum dot may emit light of a desired wavelength with an increased quantum efficiency and a narrow FWHM when a shell is formed on the aforementioned core of the embodiments.

Without wishing to be bound by any theory, it is believed that an amide ligand having a structure represented by Chemical Formula 1 (e.g., having a wedge structure illustrated in FIG. 1) may readily and relatively densely surround a zinc precursor at an early stage of a reaction for forming the core, which enables a uniform and fast nucleation and makes it possible to stabilize the core. For example, it is believed that for the fast nucleation, forming a relatively labile zinc precursor may be necessary in order for the zinc precursor and the selenium precursor to readily combine and produce a ZnSe monomer consistently. The amide ligand having the foregoing structure may couple through the oxygen atoms thereof with a zinc of the zinc precursor that does not include oxygen while the nitrogen included in the amide may also coordinate thereto, forming a labile zinc precursor having an open area (e.g., an open site). The formed nuclei may grow stably in the presence of the wedge-type amide ligand, a carboxylic acid ligand, and an amine ligand, and this makes it possible to provide the core having the foregoing features. The zinc precursor may not include a zinc-oxygen bond.

In the organic ligand mixture, an amount of each component may be determined based on an amount of the zinc precursor. In some embodiments, based on 1 mole of the zinc precursor, an amount of the carboxylic acid compound may be greater than or equal to about 0.1 moles, for example, greater than or equal to about 0.2 moles, greater than or equal to about 0.3 moles, greater than or equal to about 0.4 moles, greater than or equal to about 0.5 moles, greater than or equal to about 0.6 moles, greater than or equal to about 0.7 moles, greater than or equal to about 0.8 moles, greater than or equal to about 0.9 moles, greater than or equal to about 1 mole, greater than or equal to about 1.1 moles, greater than or equal to about 1.2 moles, greater than or equal to about 1.3 moles, or greater than or equal to about 1.4 moles. Based on 1 mole of the zinc precursor, an amount of the carboxylic acid compound may be less than or equal to about 10 moles, for example, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, less than or equal to about 2 moles.

Based on 1 mole of the zinc precursor, an amount of the primary amine compound in the organic ligand mixture may be greater than or equal to about 0.1 moles, for example, greater than or equal to about 0.2 moles, greater than or equal to about 0.3 moles, greater than or equal to about 0.4 moles, greater than or equal to about 0.5 moles, greater than or equal to about 0.6 moles, greater than or equal to about 0.7 moles, greater than or equal to about 0.8 moles, greater than or equal to about 0.9 moles, greater than or equal to about 1 moles, greater than or equal to about 1.1 moles, greater than or equal to about 1.2 moles, greater than or equal to about 1.3 moles, greater than or equal to about 1.4 moles. Based on 1 mole of the zinc precursor, an amount of the primary amine compound may be less than or equal to about 10 moles, for example, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, or less than or equal to about 2 moles.

Based on 1 mole of the zinc precursor, an amount of the secondary amide compound in the organic ligand mixture may be greater than or equal to about 0.1 moles, for example, greater than or equal to about 0.2 moles, greater than or equal to about 0.3 moles, greater than or equal to about 0.4 moles, greater than or equal to about 0.5 moles, greater than or equal to about 0.6 moles, greater than or equal to about 0.7 moles, greater than or equal to about 0.8 moles, greater than or equal to about 0.9 moles, greater than or equal to about 1 moles, greater than or equal to about 1.1 moles, greater than or equal to about 1.2 moles, greater than or equal to about 1.3 moles, or greater than or equal to about 1.4 moles. Based on 1 mole of the zinc precursor, an amount of the secondary amide compound may be less than or equal to about 10 moles, for example, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, or less than or equal to about 2 moles.

With respect to a total amount of the carboxylic acid ligand and the primary amine ligand in the organic ligand mixture, an amount of the secondary amide compound may be selected in light of reaction conditions such as a temperature, a time, and the like. For example, with respect to a total of 1 mole of the carboxylic acid ligand and the primary amine ligand, an amount the secondary amide may be greater than or equal to about 0.01 moles, for example, greater than or equal to about 0.05 moles, greater than or equal to about 0.1 moles, or greater than or equal to about 0.2 moles. With respect to a total of 1 mole of the carboxylic acid ligand and the primary amine ligand, an amount the secondary amide may be less than or equal to about 1 mole, for example, less than or equal to about 0.9 moles, less than or equal to about 0.8 moles, less than or equal to about 0.7 moles, less than or equal to about 0.6 moles, less than or equal to about 0.5 moles, less than or equal to about 0.4 moles, less than or equal to about 0.3 moles, less than or equal to about 0.2 moles, or less than or equal to about 0.1 moles. A molar ratio between the carboxylic acid ligand and the primary amine ligand is not particularly limited and may be selected appropriately. For example, a molar ratio between the carboxylic acid ligand and the primary amine ligand (the carboxylic acid ligand:the primary amine ligand) may be about 1:10 to about 1:0.1 (i.e., about 1:10 to about 10:1).

In some embodiments, with respect to 1 mole of the carboxylic acid ligand compound, an amount of the primary amine compound may be greater than or equal to about 0.1 moles, greater than or equal to about 0.2 moles, greater than or equal to about 0.3 moles, greater than or equal to about 0.4 moles, greater than or equal to about 0.5 moles, greater than or equal to about 0.6 moles, greater than or equal to about 0.7 moles, greater than or equal to about 0.8 moles, greater than or equal to about 0.9 moles, or greater than or equal to about 1 mole and less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, or less than or equal to about 2 moles. In some embodiments, the amount of the carboxylic acid ligand may be greater than the amount of the primary amine compound.

The organic ligand mixture may be prepared by mixing the carboxylic acid compound, the primary amine compound, and the secondary amide compound at the foregoing ratios.

In some embodiments, the organic ligand mixture may be prepared by heating the carboxylic acid compound and the primary amine compound in the organic solvent at a temperature of greater than or equal to about 200° C. (for example, greater than or equal to about 210° C., greater than or equal to about 220° C., greater than or equal to about 230° C., greater than or equal to about 240° C., greater than or equal to about 250° C., or greater than or equal to about 260° C.) for a predetermined time (for example, greater than or equal to about 5 minutes, greater than or equal to about 10 minutes, greater than or equal to about 15 minutes, or greater than or equal to about 20 minutes) (hereinafter, also referred to as "in-situ synthesis of the ligand mixture").

In the in-situ synthesis of the ligand mixture, an amount of the primary amine compound may be greater than or equal to about 0.5 moles, for example, greater than or equal to about 0.6 moles, greater than or equal to about 0.7 moles, greater than or equal to about 0.8 moles, greater than or equal to about 0.9 moles, or greater than or equal to about 1 mole, with respect to 1 mole of the carboxylic acid compound.

In the in-situ synthesis of the ligand mixture, an amount of the primary amine compound may be less than or equal to about 3 moles, for example, less than or equal to about 2.9 moles, less than or equal to about 2.8 moles, less than or equal to about 2.7 moles, less than or equal to about 2.6 moles, less than or equal to about 2.5 moles, less than or equal to about 2.3 moles, less than or equal to about 2.2 moles, less than or equal to about 2.1 moles, less than or equal to about 2.0 moles, less than or equal to about 1.9 moles, less than or equal to about 1.8 moles, less than or equal to about 1.7 moles, less than or equal to about 1.6 moles, less than or equal to about 1.5 moles, with respect to 1 mole of the carboxylic acid compound. In the in-situ synthesis of the ligand mixture, the carboxylic acid compound may be used in an amount that is greater than that of the primary amine compound.

The first organic solvent is not particularly limited and may be selected appropriately. The first organic solvent may include a secondary amine having at least one (e.g., one or two same or different) C6 to C40 aliphatic hydrocarbon groups (e.g., alkyl, alkenyl, or alkynyl) such as dioctylamine, dinonylamine, or the like, a tertiary amine having at least one (e.g., one, or two, or three same or different) C6 to C40 aliphatic hydrocarbon groups (e.g., alkyl, alkenyl, or alkynyl) such as a trioctyl amine, a nitrogen-containing heterocyclic compound such as pyridine, a C6 to C50 aliphatic hydrocarbon (e.g., C6 to C40 alkene or olefin solvent such as octadecene, or a C6 to C40 alkane such as hexadecane, octadecane, or squalane), an aromatic hydrocarbon (e.g., an aryl substituted with a C1 to C24 (C6 to C24) alkyl group (e.g., phenyldodecane, phenyltetradecane, or phenyl hexadecane), a primary, secondary, or tertiary phosphine (e.g., trioctyl phosphine) with at least one (e.g., 1, 2, or 3) same or different C6 to C22 alkyl group, a primary, secondary, or tertiary phosphine oxide (e.g., trioctylphosphine oxide) substituted with at least one (e.g., 1, 2, or 3) same or different C6 to C22 alkyl group, a C12 to C22 aromatic ether such as a phenyl ether or a benzyl ether, or a combination thereof.

In the organic ligand mixture, an amount of the organic solvent may be selected appropriately in light of the amount of the precursor set forth below and is not particularly limited.

The organic ligand mixture thus prepared is heated in an inert atmosphere at a first temperature to obtain a heated organic ligand mixture. The first temperature may be greater than or equal to about 240° C., for example, greater than or equal to about 245° C., greater than or equal to about 250° C., greater than or equal to about 255° C., greater than or equal to about 260° C., greater than or equal to about 265° C., greater than or equal to about 270° C., or greater than or equal to about 275° C. The first temperature may be less than or equal to about the first reaction temperature that will be described below.

To the heated organic ligand mixture, a zinc precursor, a selenium precursor, and optionally a tellurium precursor are added to provide a reaction mixture. The zinc precursor may not include oxygen. The selenium precursor may not include oxygen. If present, the tellurium precursor may not include oxygen.

The zinc precursor may include a Zn powder (i.e., Zn metal), an alkylated Zn compound (e.g., a C2 to C30 alkylated (e.g., dialkylated) zinc such as dimethyl zinc, diethyl zinc), a Zn halide (e.g., zinc chloride, zinc bromide, zinc iodide, or the like), a Zn cyanide, or a combination thereof.

The selenium precursor may include an organic dispersion of a selenium element in an organic solvent such as amines, phosphines, or phosphine oxide solvent. For example, the selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof.

The tellurium precursor may include an organic dispersion of a tellurium element in an organic solvent such as amines, phosphines, or phosphine oxide solvent. The tellurium precursor may include tellurium-trioctylphosphine (Te-TOP), tellurium-tributylphosphine (Te-TBP), tellurium-triphenylphosphine (Te-TPP), tellurium-diphenylphosphine (Te-DPP), or a combination thereof.

An amount of the selenium precursor for forming the core may be greater than or equal to about 20 moles, for example, greater than or equal to about 25 moles, greater than or equal to about 26 moles, greater than or equal to about 27 moles, greater than or equal to about 28 moles, greater than or equal to about 29 moles, greater than or equal to about 30 moles, greater than or equal to about 31 moles, greater than or equal to about 32 moles, greater than or equal to about 33 moles, greater than or equal to about 34 moles, greater than or equal to about 35 moles, greater than or equal to about 36 moles, greater than or equal to about 37 moles, greater than or equal to about 38 moles, greater than or equal to about 39 moles, or greater than or equal to about 40 moles, based on one mole of the tellurium precursor. The amount of the selenium precursor may be less than or equal to about 60 moles, less than or equal to about 59 moles, less than or equal to about 58 moles, less than or equal to about 57 moles, less than or equal to about 56 moles, or less than or equal to about 55 moles, based on one mole of the tellurium precursor.

The reaction mixture may be heated and kept at a first reaction temperature to synthesize a core particle.

The first reaction temperature may be greater than or equal to about 270° C., for example, greater than or equal to about 280° C., greater than or equal to about 290° C., or greater than or equal to about 300° C. The first reaction temperature may be less than or equal to about 350° C., for example, less than or equal to about 340° C., less than or equal to about 330° C., or less than or equal to about 320° C. The first reaction temperature may be greater than the first temperature. A reaction time for forming the core is not particularly limited and may be appropriately selected. For example, the reaction time may be greater than or equal to about 5 minutes, greater than or equal to about 10 minutes, greater than or equal to about 15 minutes, greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, or greater than or equal to about 50 minutes, but is not limited thereto. For example, the reaction time may be less than or equal to about 2 hours, but is not limited thereto. By controlling the reaction time, the size of the core, i.e. the first semiconductor nanocrystal particle, may be controlled.

In some embodiments, for controlling a particle size of the core, a zinc containing compound and/or the aforementioned selenium precursor may be further added during the reaction (for example, during the heating of the reaction mixture at the first reaction temperature). Examples of the zinc containing compound includes a reaction product (e.g., zinc oleate) of the aforementioned zinc precursor and the organic ligand (e.g., the oleic acid).

In an embodiment, a selenium containing compound derived from the aforementioned selenium precursors may be added during the reaction. In still another embodiment, a tellurium containing compound derived from the aforementioned tellurium precursors may be added during the reaction.

The core particle, i.e. the first semiconductor nanocrystal particle, may include $ZnSe_{1-x}Te_x$ (wherein, x is greater than 0 and less than or equal to about 0.2). In some embodiments, the core may include a ZnSe based material further including a small amount of tellurium. The core particle may have a cubic (zinc blend) crystal structure. For example, the core may include $ZnTe_xSe_{1-x}$, wherein, x is greater than 0, for example, greater than or equal to about 0.001, and less than or equal to about 0.2, for example, less than or equal to about 0.1, less than or equal to about 0.09, less than or equal to about 0.08, less than or equal to about 0.07, less than or equal to about 0.06, or less than or equal to about 0.05. The maximum wavelength of the light emission peak of the semiconductor nanocrystal particle may be increased by increasing a ratio of an amount of tellurium relative to an amount of selenium in the core.

In the core, an amount of the tellurium may be greater than or equal to about 0.001 moles, greater than or equal to about 0.005 moles, greater than or equal to about 0.006 moles, greater than or equal to about 0.007 moles, greater than or equal to about 0.008 moles, greater than or equal to about 0.009 moles, greater than or equal to about 0.01 moles, or greater than or equal to about 0.02 moles, based on one mole of the selenium. In the core, an amount of the tellurium may be less than or equal to about 0.053 moles, for example, less than or equal to about 0.05 moles, less than or equal to about 0.049 moles, less than or equal to about 0.048 moles, less than or equal to about 0.047 moles, less than or equal to about 0.046 moles, less than or equal to about 0.045 moles, less than or equal to about 0.044 moles, less than or equal to about 0.043 moles, less than or equal to about 0.042 moles, less than or equal to about 0.041 moles, or less than or equal to about 0.04 moles, based on one mole of the selenium.

Without wishing to be bound by any particular theory, the core may have various forms in terms of distributions of Zn, Se, and Te.

The (average) size of the core may be greater than or equal to about 2 nanometers (nm), greater than or equal to about 3 nm, or greater than or equal to about 4 nm. The (average) particle size of the core may be less than or equal to about 6 nm, for example less than or equal to about 5 nm.

The method may further include forming a shell including a second semiconductor nanocrystal material on the core. The formation of the shell may include providing a first shell precursor solution including a metal-containing first shell precursor, an organic ligand, and a second organic solvent;

providing a second shell precursor including a non-metal element; and heating the first shell precursor solution at a second reaction temperature and adding (or injecting) the first semiconductor nanocrystal particle and the second shell precursor thereto to conduct a reaction between the first shell precursor and the second shell precursor. By the reaction between the first and second shell precursors, the shell including the second semiconductor nanocrystal material may be disposed on at least a portion of a core surface.

The first shell precursor may include zinc. For example, the first shell precursor may be a zinc or a zinc compound. The second shell precursor may include selenium, sulfur, or a combination thereof. For example, the second shell precursor may be a selenium element or compound, a sulfur element or compound, or a combination thereof. The second semiconductor nanocrystal material may include zinc (Zn), selenium (Se), and sulfur (S).

The zinc precursor for the formation of the shell may include a Zn powder, an alkylated Zn compound (e.g., C2 to C30 alkyl (e.g., dialkyl) zinc such as dimethyl zinc, diethyl zinc), a Zn alkoxide (e.g., a zinc ethoxide), a Zn carboxylate (e.g., a zinc acetate or zinc aliphatic carboxylate, for example, zinc long chain aliphatic carboxylate such as zinc oleate), a Zn nitrate, a Zn perchlorate, a Zn sulfate, a Zn acetylacetonate, a Zn halide (e.g., a zinc chloride), a Zn cyanide, a Zn hydroxide, ZnO, a zinc peroxide, or a combination thereof. Examples of the first shell precursor may include a zinc carboxylate having a long alkyl chain such as zinc oleate or zinc stearate, dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof.

Details of the selenium precursor are the same as set forth above.

The sulfur precursor may be hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bistrimethylsilyl sulfur, ammonium sulfide, sodium sulfide, or a combination thereof.

In an embodiment, after core synthesis and during a shell growth, a solution including the shell precursors may be added to a reaction system over several times (e.g., in stages) in order for a composition of the shell to be changed or varied (e.g., in a radial direction). As non-limiting examples, in a case in which a shell of a ternary element (ABC) compound is formed, the sequence of the addition of the precursors, the amount of the precursors, and the reaction duration for the precursors (e.g., the A element precursor (e.g., a metal element such as Zn), the B element precursor (e.g., a first non-metal element such as selenium), the C element precursor (e.g., a second non-metal element such as sulfur) solutions) may be adjusted. For example, the core is added to the A element precursor solution, the B element precursor solution is added thereto, and then a reaction is performed for a predetermined time. Subsequently, at least one of the C element precursor solution and the B element precursor solution may be added to the reaction system in a form of a mixture or individually and then a reaction is performed. Herein, addition timing and the reaction time of the C element precursor solution and the B element precursor solution and a ratio of these precursors in the reaction system may be controlled.

A lattice mismatch at an interface of the core and shell may be controlled by controlling the addition times and the addition timing of the C element precursor solution and the B element precursor solution and a ratio of the precursors in the reaction system. In addition, growth energy at the surface may be controlled by changing a reaction temperature and, for example, a kind of, the C element precursor.

The organic ligand (e.g., for the formation of the shell) may coordinate to, e.g., be bound to, the surface of the produced nanocrystal particle (or the quantum dot) and may have an effect on the luminous and electrical properties thereof as well as may effectively disperse the quantum dots in a solution phase. The organic ligand may include $RCOOH$, $RNH_2$, $R_2NH$, $R_3N$, $RSH$, $RH_2PO$, $R_2HPO$, $R_3PO$, $RH_2P$, $R_2HP$, $R_3P$, $ROH$, $RCOOR$, $RHPOOH$, $RPO(OH)_2$, $R_2POOH$ (wherein, R is the same or different and is independently include a C1 to C40 substituted or unsubstituted aliphatic hydrocarbon group, C6 to C40 substituted or unsubstituted aromatic hydrocarbon group, or a combination thereof), or a combination thereof. The ligand may be may be used alone or in a mixture of two or more compounds.

Examples of the organic ligand compound may include methanethiol, ethanethiol, propanethiol, butanethiol, pentane thiol, hexanethiol, octanethiol, dodecanethiol, hexadecanethiol, octadecane thiol, benzylthiol; methylamine, ethylamine, propylamine, butylamine, pentylamine, hexylamine, octylamine, dodecylamine, hexadecylamine, oleylamine, octadecylamine, dimethylamine, diethylamine, dipropylamine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, stearic acid; phosphine such as methylphosphine, ethylphosphine, propylphosphine, butylphosphine, pentylphosphine, tributylphosphine, or trioctylphosphine; a phosphine oxide compound such as methylphosphine oxide, ethylphosphine oxide, propylphosphine oxide, butylphosphine oxide, or trioctylphosphine oxide; a diphenylphosphine or triphenylphosphine compound, or an oxide compound thereof; phosphonic acid, or the like, but are not limited thereto. The organic ligand compound may be used alone or in a mixture of two or more compounds. In an embodiment, the organic ligand compound may be a combination of RCOOH and amine (e.g., $RNH_2$, $R_2NH$, and/or $R_3N$).

The second organic solvent may be a C6 to C40 (e.g., C6 to C22) primary amine such as a hexadecylamine (i.e., a primary amine having at least one C6 to C40 (aliphatic) hydrocarbon group), a C6 to C40 (e.g., C6 to C22) secondary amine such as dioctylamine (i.e., a secondary amine having at least one C6 to C40 (aliphatic) hydrocarbon group), a C6 to C40 tertiary amine such as a trioctyl amine (i.e., a tertiary amine having at least one C6 to C40 (aliphatic) hydrocarbon group), a nitrogen-containing heterocyclic compound such as pyridine, a C6 to C40 olefin such as octadecene, a C6 to C40 aliphatic hydrocarbon such as hexadecane, octadecane, or squalane, a C6 to C50 aromatic hydrocarbon, an aromatic hydrocarbon substituted with a C6 to C30 (aliphatic) hydrocarbon group (e.g., alkyl group) such as phenyldodecane, phenyltetradecane, or phenyl hexadecane, a phosphine compound such as a primary, secondary, or tertiary phosphine (e.g., trioctyl phosphine) substituted with at least one (e.g., 1, 2, or 3) C6 to C22 (aliphatic) hydrocarbon group (e.g., alkyl or alkenyl), a phosphine oxide compound such as a primary, secondary, or tertiary phosphine oxide (e.g., trioctylphosphine oxide) substituted with at least one (e.g., 1, 2, or 3) C6 to C22 (aliphatic)

hydrocarbon group (e.g., alkyl or alkenyl), a C12 to C22 aromatic ether such as a phenyl ether or a benzyl ether, or a combination thereof.

Reaction conditions (e.g., a reaction temperature or time) for the shell formation are not particularly limited and may be selected appropriately. In a non-limiting example embodiment, under a vacuum, a solvent and optionally the ligand compound are heated (or vacuum-treated) at a predetermined temperature (e.g., greater than or equal to about 100° C.), and are heated again at predetermined temperature (e.g., greater than or equal to about 100° C.) under an inert gas atmosphere. Then, the core is injected, the shell precursors are sequentially or simultaneously added, and then heated at a predetermined reaction temperature to conduct a reaction. Mixtures each including the shell precursors at a different ratio may be sequentially injected during the reaction time.

After the completion of the reaction, a non-solvent is added to reaction products and the nanocrystal particles coordinated with, e.g., bound to, the ligand compound may be separated. The non-solvent may be a polar solvent that is miscible with the solvent used in the core formation and/or shell formation reactions and is not capable of dispersing the produced nanocrystals therein. The non-solvent may be selected depending the solvent used in the reaction and may be for example acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. Separation of the nanocrystal particles may involve centrifugation, sedimentation, chromatography, or distillation. The separated nanocrystal particles may be added to a washing solvent and washed, if desired. Types of the washing solvent are not particularly limited and a solvent having similar solubility parameter to that of the ligand may be used and examples thereof may include hexane, heptane, octane, chloroform, toluene, benzene, or the like.

In other embodiments, a quantum dot includes a core including a first semiconductor nanocrystal material including zinc, tellurium, and selenium and a shell disposed on at least a portion of the core and including a second semiconductor nanocrystal material different from the first semiconductor nanocrystal material. The quantum dot does not include cadmium. A maximum photoluminescent emission peak of the quantum dot is in a wavelength region between about 440 nanometers (nm) to 540 nm. The quantum dot exhibits a quantum efficiency of greater than or equal to about 60%. The first semiconductor nanocrystal material may include $ZnTe_x Se_{1-x}$ (wherein, x is greater than about 0 and less than or equal to about 0.2).

Details of the core are the same as set forth above.

In the quantum dot, a ratio of a mole amount (i.e., molar amount) of the tellurium with respect to that of selenium (e.g., measured by inductively coupled plasma-atomic emission spectroscopy (ICP-AES)) may be less than or equal to about 0.1, less than or equal to about 0.09, less than or equal to about 0.08, less than or equal to about 0.07, less than or equal to about 0.06, less than or equal to about 0.05, less than or equal to about 0.049, less than or equal to about 0.048, less than or equal to about 0.047, less than or equal to about 0.045, less than or equal to about 0.044, less than or equal to about 0.043, less than or equal to about 0.042, less than or equal to about 0.041, less than or equal to about 0.04, less than or equal to about 0.039, less than or equal to about 0.035, less than or equal to about 0.03, less than or equal to about 0.029, less than or equal to about 0.025, less than or equal to about 0.024, less than or equal to about 0.023, less than or equal to about 0.022, less than or equal to about 0.021, less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, or less than or equal to about 0.01. A ratio of a mole amount of the tellurium with respect to that of selenium may be 0.001, greater than or equal to about 0.002, greater than or equal to about 0.003, greater than or equal to about 0.004, greater than or equal to about 0.005, greater than or equal to about 0.006, or greater than or equal to about 0.007. A mole ratio of the tellurium with respect to the selenium may be from about 0.004 to about 0.025.

In the quantum dot, an amount (e.g., a mole amount) of the zinc may be greater than that of the selenium. In the quantum dot, (for example, when determined by ICP-AES) a mole ratio of the tellurium with respect to the zinc may be less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, less than or equal to about 0.011, less than or equal to about 0.01, less than or equal to about 0.009, less than or equal to about 0.008, less than or equal to about 0.007, or less than or equal to about 0.006.

In the quantum dot, (for example, when being determined by ICP-AES) a mole ratio of the tellurium with respect to the zinc may be greater than or equal to about 0.0001, greater than or equal to about 0.0005, or greater than or equal to about 0.001.

In the quantum dot, (for example, when being determined by ICP-AES), an amount (e.g., a mole amount) of the zinc may be greater than that of the selenium, and an amount (e.g., a mole amount) of the selenium may be greater than that of the tellurium.

For example, in the ICP-AES analysis, a mole ratio of the selenium with respect to the zinc may be less than 1, for example, less than or equal to about 0.95, less than or equal to about 0.90, less than or equal to about 0.85, or less than or equal to about 0.8.

For example, in the ICP-AES analysis, a mole ratio of the tellurium with respect to the zinc may be less than or equal to about 0.03, for example, less than or equal to about 0.027, less than or equal to about 0.025, less than or equal to about 0.02, less than or equal to about 0.019, less than or equal to about 0.018, less than or equal to about 0.017, 0.016, less than or equal to about 0.015, less than or equal to about 0.01, less than or equal to about 0.009, less than or equal to about 0.008, less than or equal to about 0.007, less than or equal to about 0.006, or less than or equal to about 0.005. A mole ratio of the tellurium with respect to the zinc may be greater than or equal to about 0.001, greater than or equal to about 0.002, or greater than or equal to about 0.003. In the quantum dot of some embodiments, an amount of the tellurium may be less than or equal to about 1 wt % with respect to a total weight of the quantum dot.

In the quantum dots, a mole ratio of the sulfur with respect to the zinc may be greater than or equal to about 0.1, for example, greater than or equal to about 0.15, or greater than or equal to about 0.2. In the quantum dots, a mole ratio of the sulfur with respect to the zinc may be less than or equal to about 0.5, for example, less than or equal to about 0.45.

In the quantum dots, a mole ratio of a sum of the sulfur and the selenium (S+Se) with respect to the zinc may be greater than or equal to about 0.3, greater than or equal to about 0.4, or greater than or equal to about 0.5. In the quantum dots, a mole ratio of a sum of the sulfur and the selenium (S+Se) with respect to the zinc may be less than or equal to about 1, for example, less than or equal to about 1.

The quantum dot may include various shapes. The semiconductor nanocrystal may include a spherical shape, a polygonal shape, a multipod shape, or a combination thereof. In an embodiment, the semiconductor nanocrystal particle may have a multipod shape. The multipod may have at least two (e.g., at least three or at least four) branch parts and a valley part therebetween. A size (e.g., an average size) of the semiconductor nanocrystal particle may be greater than or equal to about 3 nm, for example greater than or equal to about 4 nm, greater than or equal to about 5 nm, or greater than or equal to about 6 nm. The size of the semiconductor nanocrystal may be less than or equal to about 50 nm, for example less than or equal to about 45 nm, less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, or less than or equal to about 16 nm. Herein, when the semiconductor nanocrystal particle has a spherical shape, the size of the semiconductor nanocrystal may be a diameter. When the quantum dot is a non-spherically shaped particle, its size may be a diameter calculated from a two dimensional area of an electron microscopic image of the particle. The size of the semiconductor nanocrystal particle (or the core) may be determined by for example, a Transmission Electron Microscopic analysis, but it is not limited thereto.

The quantum dots of the embodiments may emit blue light having a maximum photoluminescence peak at a wavelength of greater than or equal to about 430 nm (for example, 440 nm, or greater than or equal to about 450 nm) and less than or equal to about 470 nm (for example, less than about 470 nm, or less than or equal to about 460 nm). The blue light may have a maximum luminous peak wavelength of from about 450 nm to about 460 nm.

The quantum dots of the embodiments may emit green light having a maximum photoluminescence peak at a wavelength of greater than or equal to about 500 nm (for example, greater than or equal to about 510 nm, or greater than or equal to about 520 nm) and less than or equal to about 560 nm (for example, less than or equal to about 550 nm, or less than or equal to about 540 nm). The green light may have a maximum luminous peak wavelength of from about 520 nm to about 540 nm.

The maximum luminous peak may have a FWHM of less than or equal to about 50 nm, for example, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm.

The quantum dots may have a quantum efficiency of greater than or equal to about 60%, for example, greater than or equal to about 61%, greater than or equal to about 62%, greater than or equal to about 63%, greater than or equal to about 64%, greater than or equal to about 65%, greater than or equal to about 66%, greater than or equal to about 67%, greater than or equal to about 68%, greater than or equal to about 69%, or greater than or equal to about 70%. The quantum dots may have quantum efficiency of greater than or equal to about 80%, greater than or equal to about 90%, greater than or equal to about 95%, greater than or equal to about 99%, or about 100%.

In an embodiment, an electronic device includes the quantum dots of the embodiments. The device may include a display device, a light emitting diode (LED), an organic light emitting diode (OLED), a quantum dot LED, a sensor, a solar cell, an image sensor, or a liquid crystal display (LCD), but is not limited thereto.

In an embodiment, the electronic device may be a LCD device, a photoluminescent element (e.g., a quantum dot sheet, a quantum dot rail, a lighting device), an electroluminescent device (e.g., QD LED), or a backlight unit.

In a non-limiting embodiment, the electronic device may include a quantum dot sheet and the quantum dots of the embodiments may be included in the quantum dot sheet (e.g., in a form of a semiconductor nanocrystal-polymer composite).

In a non-limiting embodiment, the electronic device may be an electroluminescent device. The electronic device may include an anode 1 and a cathode 5 facing each other and a quantum dot emission layer 3 disposed between the anode and the cathode and including a plurality of quantum dots, and the plurality of quantum dots may include the blue light emitting semiconductor nanocrystal particle (see FIG. 2).

The cathode may include an electron injection conductor (for example, having a relatively low work function). The anode may include a hole injection conductor (for example, having a relatively high work function). The electron/hole injection conductors may include a metal (e.g., aluminum, magnesium, tungsten, nickel, cobalt, platinum, palladium, calcium, or LiF), a metal compound, an alloy, or a combination thereof; a metal oxide such as gallium indium oxide or indium tin oxide; or a conductive polymer such as polyethylene dioxythiophene (e.g., having a relatively high work function), but are not limited thereto.

At least one of the cathode and the anode may be a light transmitting electrode or a transparent electrode. In an embodiment, both of the anode and the cathode may be light transmitting electrodes. The electrode may be patterned.

The light transmitting electrode may include, for example, a transparent conductor such as indium tin oxide (ITO) or indium zinc oxide (IZO), gallium indium tin oxide, zinc indium tin oxide, titanium nitride, polyaniline, or LiF/Mg:Ag, or a metal thin film of a thin monolayer or multilayer, but is not limited thereto. When one of the cathode and the anode is a non-light transmitting electrode, it may include, for example, an opaque conductor such as aluminum (Al), a lithium aluminum (Li:Al) alloy, a magnesium-silver alloy (Mg:Ag), or a lithium fluoride-aluminum (LiF:Al).

The light transmitting electrode may be disposed on a transparent substrate (e.g., insulating transparent substrate). The substrate may be rigid or flexible. The substrate may be a plastic, glass, or a metal.

Thicknesses of the anode and the cathode are not particularly limited and may be selected considering device efficiency. For example, the thickness of the anode (or the cathode) may be greater than or equal to about 5 nm, for example, greater than or equal to about 50 nm, but is not limited thereto. For example, the thickness of the anode (or the cathode) may be less than or equal to about 100 micrometers (μm), for example, less than or equal to about 10 um, less than or equal to about 1 μm, less than or equal to about 900 nm, less than or equal to about 500 nm, or less than or equal to about 100 nm, but is not limited thereto.

The quantum dot emission layer includes a plurality of quantum dots. The plurality of quantum dots includes the blue light emitting semiconductor nanocrystal particle according to the aforementioned embodiments. The quantum dot emission layer may include a monolayer of the blue light emitting semiconductor nanocrystal particles.

The quantum dot emission layer may be formed by preparing a dispersion including the quantum dots dispersed in a solvent, applying the dispersion via spin coating, ink jet coating, or spray coating, and drying the same. The emissive layer may have a thickness of greater than or equal to about 5 nm, for example, greater than or equal to about 10 nm, greater than or equal to about 15 nm, greater than or equal to about 20 nm, or greater than or equal to about 25 nm, and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, or less than or equal to about 30 nm.

Figure 2:
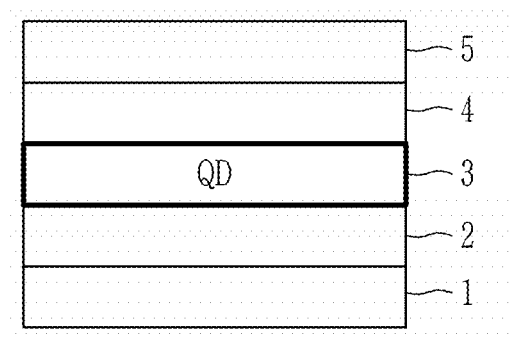
FIG. 2 is a schematic cross-sectional view of a quantum dot (QD) light emitting diode (LED) device according to a non-limiting embodiment.

The electronic device may include charge (hole or electron) auxiliary layers between the anode and the cathode. For example, as shown in FIG. 2, the electronic device may include a hole auxiliary layer 2 or an electron auxiliary layer 4 between the anode and the quantum dot emission layer and/or between the cathode and the quantum dot emission layer.

In the figures, the electron/hole auxiliary layer is formed as a single layer, but it is not limited thereto and may include a plurality of layers including at least two stacked layers.

The hole auxiliary layer may include for example a hole injection layer (HIL) to facilitate hole injection, a hole transport layer (HTL) to facilitate hole transport, an electron blocking layer (EBL) to inhibit electron transport, or a combination thereof. For example, the hole injection layer may be disposed between the hole transport layer and the anode. For example, the electron blocking layer may be disposed between the emission layer and the hole transport (injection) layer, but is not limited thereto. A thickness of each layer may be selected appropriately. For example, a thickness of each layer may be greater than or equal to about 1 nm, greater than or equal to about 5 nm, greater than or equal to about 10 nm, greater than or equal to about 15 nm, greater than or equal to about 20 nm, or greater than or equal to about 25 nm, and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, or less than or equal to about 50 nm, but is not limited thereto. The hole injection layer may be an organic layer that is formed by a solution process (e.g., spin coating etc.) such as PEDOT:PSS. The hole transport layer may be an organic layer that is formed by a solution process (e.g., spin coating etc.).

The electron auxiliary layer may include for example an electron injection layer (EIL) to facilitate electron injection, an electron transport layer (ETL) to facilitate electron transport, a hole blocking layer (HBL) to inhibit hole transport, or a combination thereof. For example, the electron injection layer may be disposed between the electron transport layer and the cathode. For example, the hole blocking layer may be disposed between the emission layer and the electron transport (injection) layer, but is not limited thereto. A thickness of each layer may be selected appropriately. For example, a thickness of each layer may be greater than or equal to about 1 nm, greater than or equal to about 5 nm, greater than or equal to about 10 nm, greater than or equal to about 15 nm, greater than or equal to about 20 nm, or greater than or equal to about 25 nm, and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, less than or equal to about 50 nm, but is not limited thereto. The electron injection layer may be an organic layer formed by deposition (e.g., vapor deposition). The electron transport layer may include an inorganic oxide or a (nano or fine) particles thereof or may include an organic layer formed by deposition.

The quantum dot emission layer may be disposed in or on the hole injection (or transport) layer or an electron injection (or transport) layer. The quantum dot emission layer may be disposed as a separate layer between the hole auxiliary layer and the electron auxiliary layer.

The charge auxiliary layer, the electron blocking layer, and the hole blocking layer may include for example an organic material, an inorganic material, or an organic/inorganic material. The organic material may be a compound having hole or electron-related properties. The inorganic material may be for example a metal oxide such as molybdenum oxide, tungsten oxide, zinc oxide, or nickel oxide, but is not limited thereto.

The hole transport layer (HTL) and/or the hole injection layer may include, each independently, for example poly(3,4-ethylenedioxythiophene):poly(styrene sulfonate) (PEDOT:PSS), poly(9,9-dioctyl-fluorene-co-N-(4-butylphenyl)-diphenylamine) (TFB), polyarylamine, poly(N-vinylcarbazole, PVK), polyaniline, polypyrrole, N,N,N',N'-tetrakis (4-methoxyphenyl)-benzidine (TPD), 4,4',-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino)phenylcyclohexane (TAPC), a p-type metal oxide (e.g., NiO, $WO_3$, $MoO_3$, etc.), p-type metal sulfide (e.g., ZnS), a carbonaceous material such as graphene oxide, or a combination thereof, but is not limited thereto.

The electron blocking layer (EBL) may include for example poly(3,4-ethylenedioxythiophene):poly(styrene sulfonate) (PEDOT:PSS), poly(9,9-dioctyl-fluorene-co-N-(4-butylphenyl)-diphenylamine) (TFB) polyarylamine, poly (N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

The electron transport layer (ETL) and/or the electron injection layer (EIL) may, each independently, include for example 1,4,5,8-naphthalene-tetracarboxylic dianhydride (NTCDA), bathocuproine (BCP), tris[3-(3-pyridyl)-mesityl]

borane (3TPYMB), LiF, Alq$_3$, Gaq$_3$, Inq$_3$, Znq$_2$, Zn(BTZ)$_2$, BeBq$_2$, ET204 (8-(4-(4,6-di(naphthalen-2-yl)-1,3,5-triazin-2-yl)phenyl)quinolone), 8-hydroxyquinolinato lithium (Liq), an n-type metal oxide (e.g., ZnO, HfO$_2$, etc.), or a combination thereof, but is not limited thereto. The n-type metal oxide may be (crystalline) nanoparticles. The electron transport layer (ETL) may include crystalline nanoparticles including a zinc oxide compound (e.g., ZnO).

The hole blocking layer (HBL) may include for example 1,4,5,8-naphthalene-tetracarboxylic dianhydride (NTCDA), bathocuproine (BCP), tris[3-(3-pyridyl)-mesityl] borane (3TPYMB), LiF, Alq$_3$, Gaq$_3$, Inq$_3$, Znq$_2$, Zn(BTZ)$_2$, BeBq$_2$, or a combination thereof, but is not limited thereto.

In the foregoing "q" is 8-hydroxyquinoline, "BTZ" is 2-(2-hydroxyphenyl)benzothiazolate, and "Bq" is 10-hydroxybenzo[h]quinoline. The n-type metal oxide may be crystalline.

Figure 3:
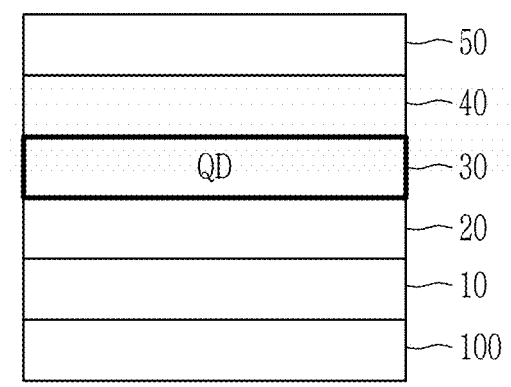
FIG. 3 is a schematic cross-sectional view of a QD LED device according to a non-limiting embodiment.

A device according to an embodiment as shown in FIG. 3 may have a normal structure. In the device, an anode 10 disposed on a transparent substrate 100 may include a metal oxide transparent electrode (e.g., ITO electrode) and a cathode 50 facing the anode may include a metal (Mg, Al, etc.) of a predetermined (e.g., relatively low) work function. For example, a hole auxiliary layer 20 (e.g., a hole transport layer including TFB and/or PVK and/or a hole injection layer including PEDOT:PSS and/or a p-type metal oxide) may be disposed between the transparent electrode 10 and the emission layer 30. An electron auxiliary layer (e.g., electron transport layer) 40 may be disposed between the quantum dot emission layer 30 and the cathode 50.

Figure 4:
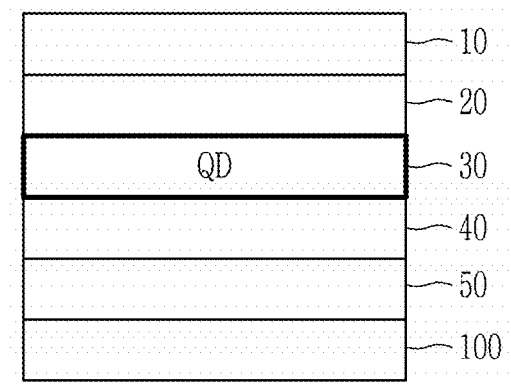
FIG. 4 is a schematic cross-sectional view of a QD LED device according to a non-limiting embodiment.

A device according to an embodiment as shown in FIG. 4 has an inverted structure. In the device of the embodiments, a cathode 50 disposed on a transparent substrate 100 may include a metal oxide transparent electrode (e.g., ITO) and an anode 10 facing the cathode may include a metal (e.g., Au, Ag, etc.) of a predetermined (e.g., relatively high) work function. For example, an n-type metal oxide (ZnO) may be disposed between the transparent electrode 50 and the emission layer 30 as an electron auxiliary layer (e.g., an electron transport layer) 40. A hole auxiliary layer 20 (e.g., a hole transport layer including TFB and/or PVK and/or a hole injection layer including MoO$_3$ or another p-type metal oxide) may be disposed between the metal anode 10 and the quantum dot emission layer 30. Hereinafter, examples are illustrated. However, these examples are exemplary, and the present disclosure is not limited thereto.

EXAMPLES

Analysis Method
[1] Fourier-Transform Infrared (FT-IR) Spectroscopy and Nuclear Magnetic Resonance (NMR) Analysis
A FT-IR analysis is made using Varian 670-IR with Miracle accessory and a NMR analysis is made using Bruker Advance III Ascend 500 MHz NMR spectrometer.
[2] Photoluminescence Analysis
Photoluminescence (PL) spectra of the produced nanocrystals are obtained using a Hitachi F-7000 spectrometer at an irradiation wavelength of 372 nm.

[3] Ultraviolet (UV) Spectroscopy Analysis
UV spectroscopy analysis is performed using a Hitachi U-3310 spectrometer to obtain a UV-Visible absorption spectrum.
[4] Transmission Electron Microscope (TEM) Analysis
Transmission electron microscope photographs of nanocrystals are obtained using an UT F30 Tecnai electron microscope.
[5] ICP Analysis
An inductively coupled plasma-atomic emission spectroscopy (ICP-AES) analysis is performed using Shimadzu ICPS-8100.

Synthesis is performed under an inert gas atmosphere unless particularly mentioned.

Reference Example 1: Formation of Amide Ligand 50 mL of trioctylamine is placed in reaction flask, and 9 millimoles (mmol) of oleic acid and 9 mmol of hexadecyl amine are added thereto. A resulting mixture is heated at 280° C. for 10 minutes and then is cooled to room temperature (ca. 23° C.). The precipitated solid is separated via centrifugation and then is washed with hexane at least three times and is filtered and then dried under vacuum.

Figure 5:
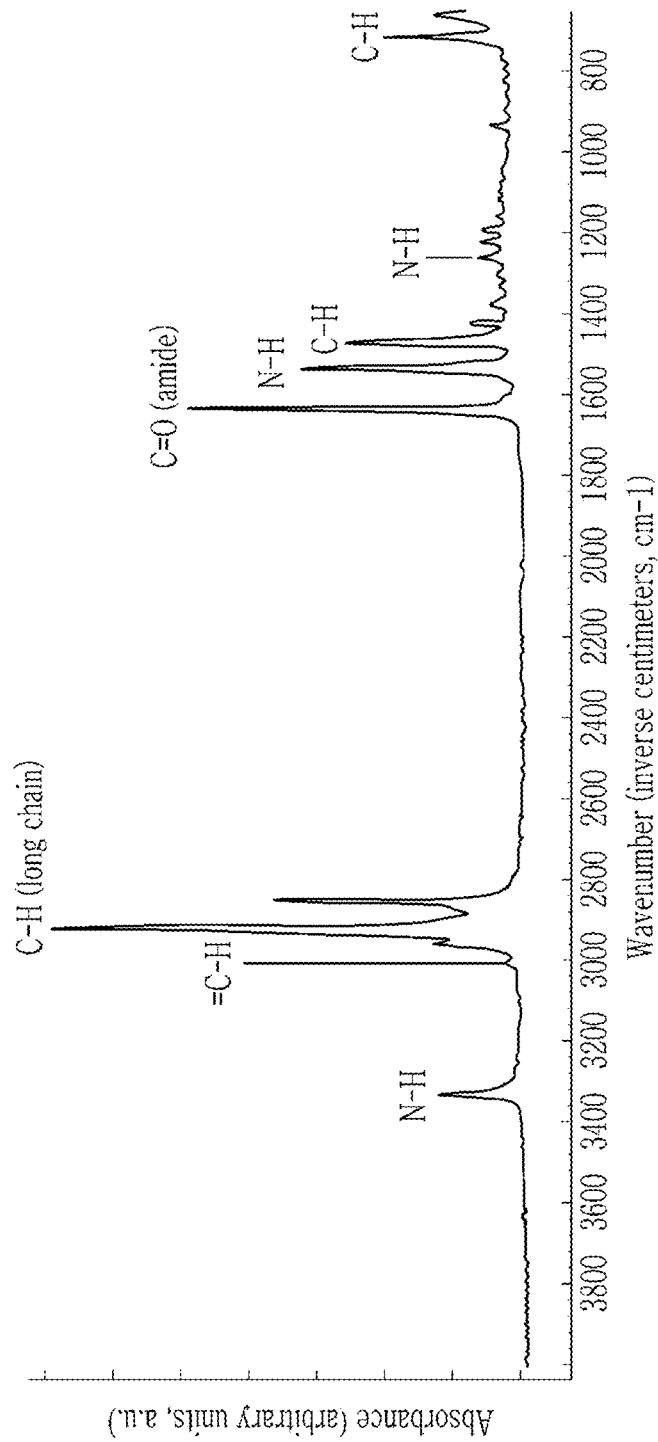
FIG. 5 is a graph of absorbance (arbitrary units, a.u.) versus wavenumber (inverse centimeters, $cm^{-1}$) and shows a result of Fourier transform infrared spectroscopy (FT-IR) for an amide organic ligand compound synthesized in Reference Example 1.
Figure 6:
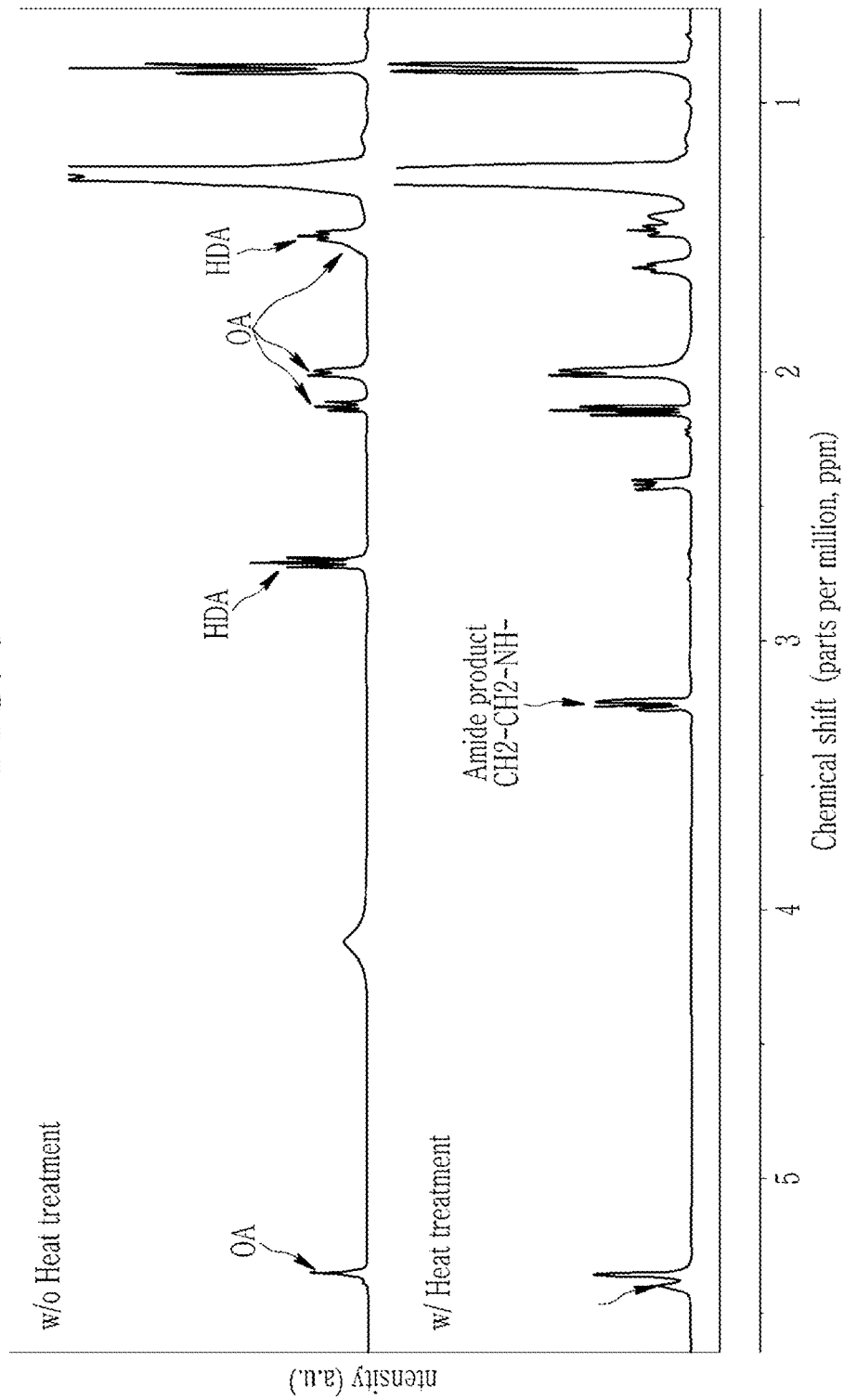
FIG. 6 is a graph of intensity (a.u.) versus chemical shift δ (parts per million, ppm) and shows Nuclear Magnetic Resonance (NMR) spectra of a mixture prior to being heat-treated (top spectrum) and an amide organic ligand compound synthesized via a thermal treatment in Reference Example 1 (bottom spectrum)

An FT-IR analysis and an NMR analysis are conducted for the formed product and the results are shown in FIG. 5 and FIG. 6 (bottom), respectively.

An NMR analysis is also made for the mixture prior to the reaction and the results are shown in FIG. 6 (top).

FIG. 5 and FIG. 6 confirmed that the synthesized solid includes a compound having the following structure with an amide moiety and long alkyl and alkenyl moieties:

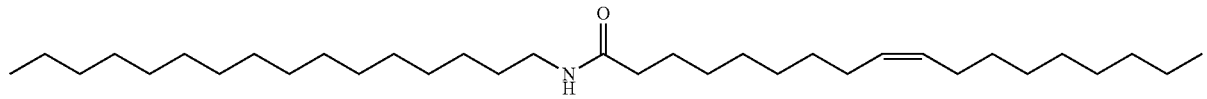 [SMILES: CCCCCCCC/C=C\CCCCCCCC(=O)NCCCCCCCCCCCCCCCC]

In a NMR spectrum of FIG. 6 (bottom), a peak at 3.2 parts per million (ppm) is assigned to the one derived from the alkyl adjacent to the amide moiety.

Example 1-1: Production of ZnTeSe Core

Selenium and tellurium are dispersed in trioctylphosphine (TOP) to obtain a 2 molar (M) Se/TOP stock solution and a 0.1 M Te/TOP stock solution.

A 1M hexane solution of diethyl zinc is prepared.

Trioctylamine is placed in a 300 mL reaction flask and oleic acid (OA), hexadecylamine (HDA), and the amide ligand synthesized in Reference Example 1 are added thereto, each at a mole ratio of 1.5 moles with respect to 1 mole of a zinc precursor (that will be described below, i.e., diethylzinc), respectively. After an atmosphere in the flask is exchanged with nitrogen, the reaction flask is heated at 280° C. for 10 minutes to prepare a heat-treated ligand mixture.

After raising a temperature of the heat-treated ligand mixture to 300° C., a diethylzinc stock solution is injected into the flask and then the prepared Se/TOP stock solution and Te/TOP stock solution are rapidly added thereto in a Te/Se ratio of 1/25. A reaction proceeds for 40 minutes at the same temperature.

After the reaction, the reaction solution is rapidly cooled to room temperature and ethanol is added thereto. Precipitates thus obtained are subjected to centrifugation to recover a ZnSeTe core. The recovered ZnSeTe core particles are dispersed in toluene.

Figure 7:
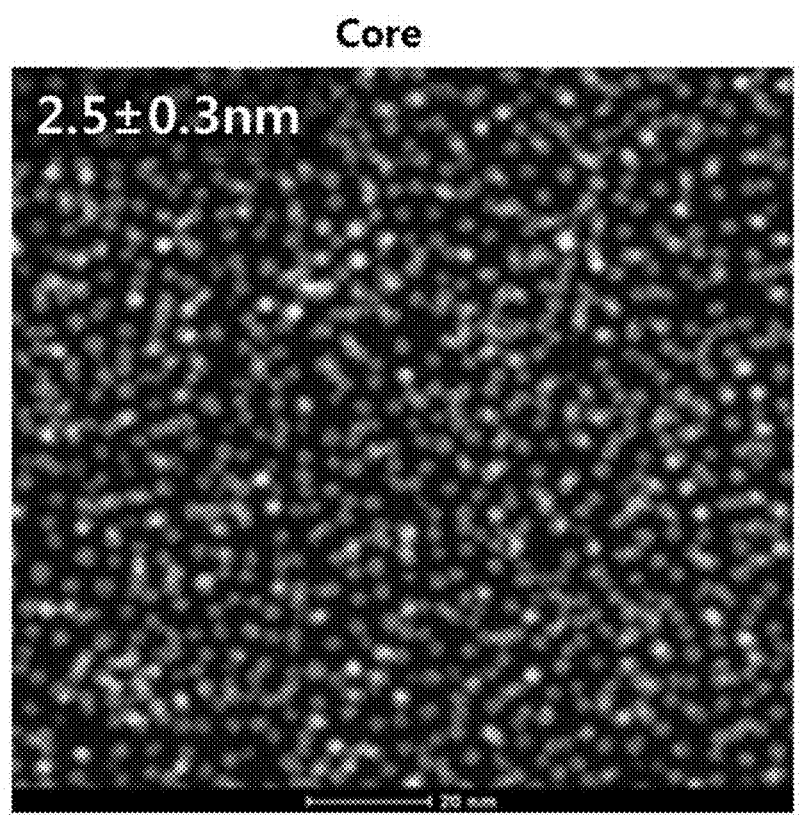
FIG. 7 shows a transmission electron microscope (TEM) image of the ZnTeSe cores produced in Example 1-1.

A transmission electron microscopic analysis is made for the core particles and the results are shown in FIG. 7. The results confirm that the obtained core particles have uniform particle sizes (2.5±0.3 nm) and their shapes are generally spherical.

Figure 9:
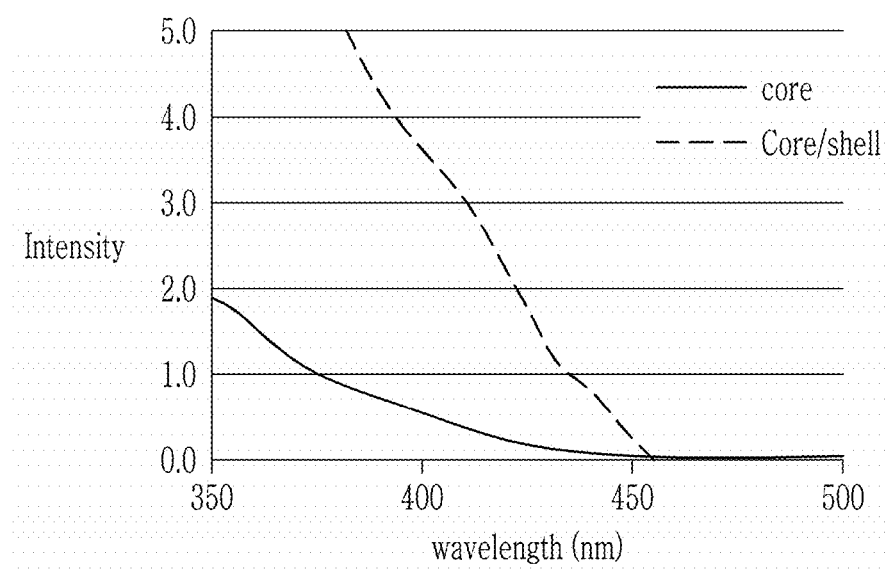
FIG. 9 is a graph of intensity (a.u.) versus wavelength (nanometers, nm) and shows ultraviolet-visible (UV-vis) absorption spectra of the core particles (solid line) and the core-shell quantum dots (dashed line) prepared in Example 1.
Figure 10:
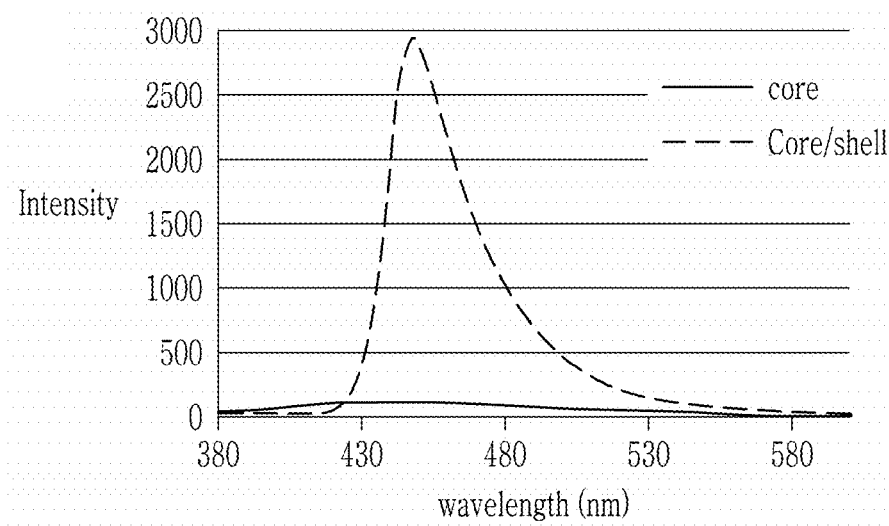
FIG. 10 is a graph of intensity (a.u.) versus wavelength (nm) and shows photoluminescent emission spectra of the core particles (solid line) and the core-shell quantum dots (dashed line) prepared in Example 1.

With respect to the obtained core particles, a UV-vis spectroscopic analysis and photoluminescence spectroscopic analysis are made and the results are shown in FIG. 9, FIG. 10, and Table 1.

Example 1-2: ZnSeS Shell Formation on a ZnSeTe Core

In a 300 mL reaction flask, TOA is placed and zinc acetate and oleic acid are added thereto at a mole ratio of 1:2, then the mixture is vacuum-treated at 120° C. for 10 minutes. After the atmosphere in the flask is replaced with $N_2$, it is heated to 280° C. A toluene dispersion of the ZnTeSe cores prepared in Example 1-1 is injected rapidly and then Se/TOP stock solution and S/TOP stock solution are added thereto over three or four times (together with a Zn precursor, if desired) while the mixture is heated to 320° C. and the reaction proceeds for one hour (formation of a ZnSeS layer). Finally, a S/TOP stock solution is added thereto and the reaction goes for another 20 minutes (formation of a ZnS layer).

After the completion of the reaction, the flask is cooled to room temperature and the prepared core-shell quantum dots are recovered via precipitation using ethanol and centrifugation. The obtained quantum dots are dispersed in toluene.

Figure 8:
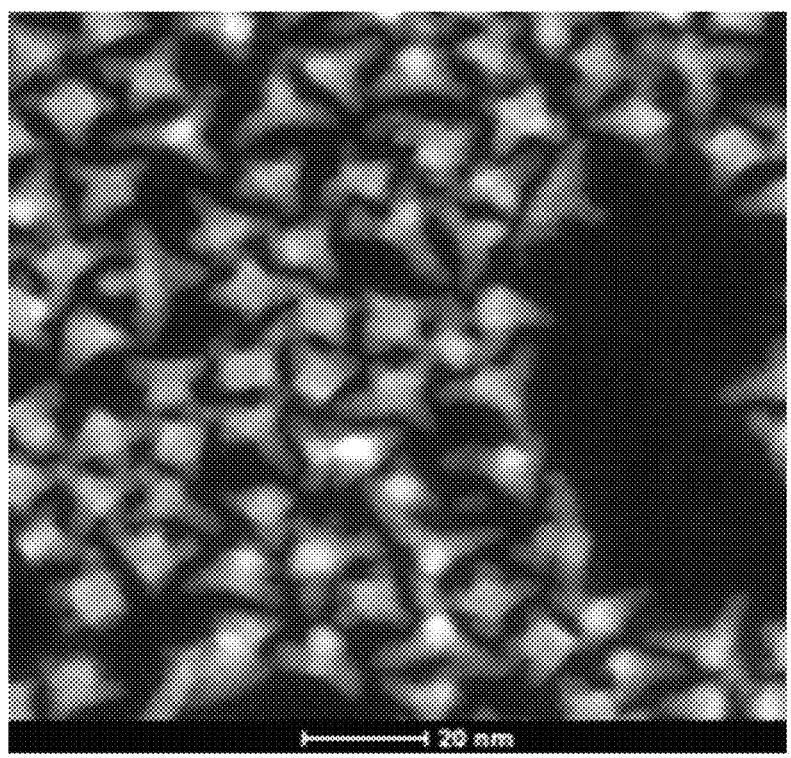
FIG. 8 shows a TEM image of the core-shell quantum dot produced in Example 1-2.

With respect to the core-shell quantum dot particles, a transmission electron microscopic analysis is made and the results are shown in FIG. 8. The results of FIG. 8 confirm that the obtained quantum dots have multipod shapes and an average size thereof is about 8.9 nm.

With respect to the obtained core-shell particles, a UV-vis spectroscopic analysis and photoluminescence spectroscopic analysis are made and the results are shown in FIG. 9, FIG. 10, and Table 1.

TABLE 1

| | Photoluminescence (excitation at 372 nm) | | Quantum efficiency (QE) |
|---|---|---|---|
| | Maximum peak wavelength (nm) | FWHM (nm) | |
| Core particle | 442 | 100 | 8% |
| Core-shell quantum dot | 448 | 33 | 95% |

Results of FIG. 9, FIG. 10, and Table 1 confirm that the UV-vis absorption spectrum of the prepared core particles have an inflection point, thus having a valley. In addition, the PL spectrum of the core has a broad peak.

Results of FIG. 9, FIG. 10, and Table 1 confirm that the UV-vis absorption spectrum of the prepared core-shell particles do not really have a first peak but have improved PL properties (significantly improved quantum efficiency and narrowed FWHM) in comparison with those of the core particle.

Example 2-1: Production of ZnTeSe Core (In-Situ Formation of the Ligand Mixture)

A ZnTeSe core is prepared in the same manner as set forth in Example 1-1 except that after trioctylamine is placed in a 300 mL reaction flask, oleic acid (OA) and hexadecylamine (HDA) are added thereto, each at a mole ratio of 2 mole with respect to 1 mole of a zinc precursor, an atmosphere in the flask is changed into nitrogen, and then the reaction flask is heated at 280° C. for 10 minutes to prepare a heat-treated ligand mixture.

Figure 11:
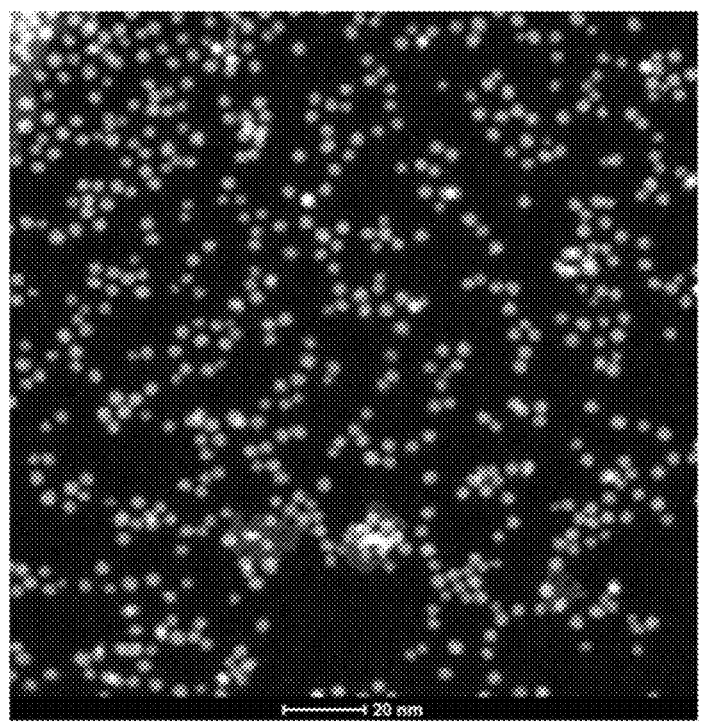
FIG. 11 shows a transmission electron microscope (TEM) image of the ZnTeSe cores produced in Example 2-1.

A transmission electron microscopic analysis is made for the core particles and the results are shown in FIG. 11. The results confirm that an average particle size of the obtained core particles is about 3.5 nm (standard deviation: 0.6 nm) and their shapes are generally spherical.

With respect to the obtained core particles, a UV-vis spectroscopic analysis and photoluminescence spectroscopic analysis are made and the results are shown in Table 2.

Example 2-2: Formation of ZnSeS Shell on the ZnTeSe Core

Except for using the core prepared in Example 2-1, a core shell quantum dot is prepared in the same manner set forth in Example 1-2.

With respect to the obtained core-shell quantum dots, a UV-vis spectroscopic analysis and photoluminescence spectroscopic analysis are made and the results are shown in Table 2.

With respect to the obtained core-shell quantum dots, an ICP-AES analysis is made and the results are shown in Table 3.

Comparative Example 1-1

A ZnTeSe core is prepared in the same manner as set forth in Example 1-1 except for using the ligand mixture prepared as below: trioctylamine is placed in a 300 mL reaction flask, hexadecylamine (HDA) is added thereto at a mole ratio of 2 mole with respect to 1 mole of the zinc precursor (i.e., diethyl zinc), an atmosphere in the flask is changed into nitrogen, the reaction flask is heated at 280° C. for 10 minutes. A temperature of the flask is raised to about 300° C., and then oleic acid (OA) is added thereto at a mole ratio of 2 mole with respect to 1 mole of the zinc precursor to obtain a heated ligand mixture including the OA and the HDA without the amide.

Figure 12:
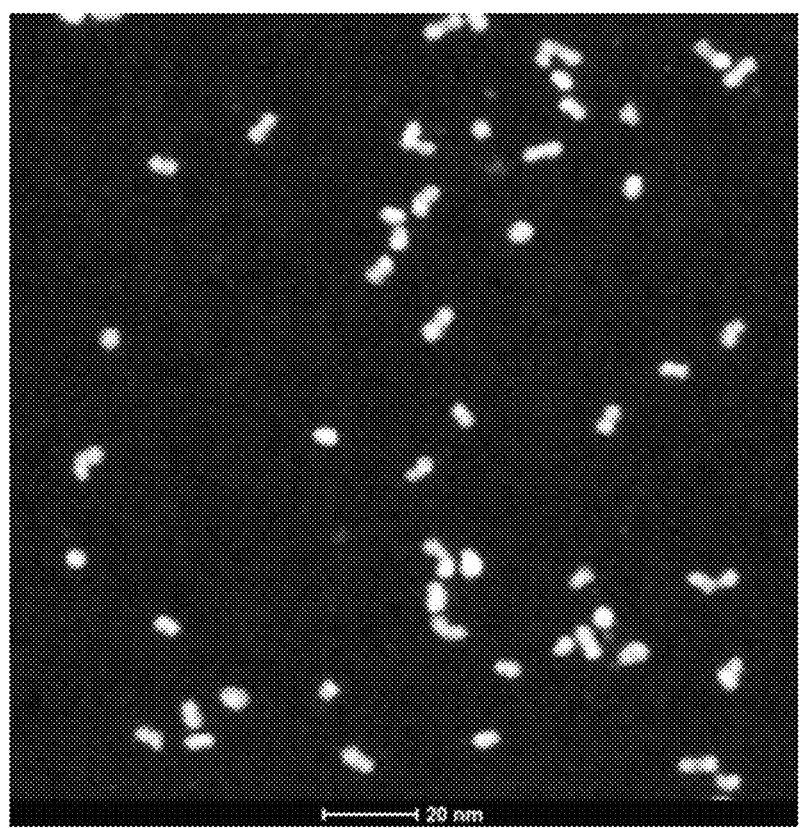
FIG. 12 shows a transmission electron microscope (TEM) image of the ZnTeSe cores produced in Comparative Example 1-1.

A transmission electron microscopic analysis is made for the core particles and the results are shown in FIG. 12. The results confirm that an average particle size of the obtained core particles is about 5.1 nm (a standard deviation: 0.8 nm) and fusion between the core particles occurs.

With respect to the obtained core particles, a UV-vis spectroscopic analysis and photoluminescence spectroscopic analysis are made and the results are shown in Table 2.

Comparative Example 1-2

Except for using the core prepared in Comparative Example 1-1, a core shell quantum dot is prepared in the same manner set forth in Example 1-2.

With respect to the obtained core-shell quantum dots, a UV-vis spectroscopic analysis and photoluminescence spectroscopic analysis are made and the results are shown in Table 2.

TABLE 2

|  |  | Photoluminescence (excitation at 372 nm) | | Quantum efficiency (QE, %) |
| --- | --- | --- | --- | --- |
|  |  | PL peak wavelength (nm) | FWHM (nm) |  |
| Example 2-1 | Core particle | 446 | 106 | 20% |
| Example 2-2 | Core-shell QD | 453 | 22 | 86% |
| Comp. Example 1-1 | Core particle | 430 | 49 | 18% |
| Comp. Example 2-1 | Core-shell QD | 449 | 26 | 47% |

The results of the UV-vis spectroscopic analysis confirm that the core particles as prepared do not show a $1^{st}$ peak in the UV-vis absorption spectrum. The results of Table 2 confirm that the core prepared in Example 2-1 has a wide FWHM and a low level of QE.

TABLE 3

|  | Mole ratio (with respect to Zn) | | | |
| --- | --- | --- | --- | --- |
|  | Zn | Se | Te | S |
| Example 2-2 | 1.000 | 0.382 | 0.002 | 0.546 |

Example 3: Changes in a Ratio Between the Used Carboxylic Acid Compound and the Used Amine Compound A core particle is prepared in the same manner set forth in Example 2-1 except that the ratio between the oleic acid and the hexadecylamine and the ratio between the selenium and the tellurium are changed as set forth in Table 4.

With respect to the obtained core particles, a UV-vis spectroscopic analysis and photoluminescence spectroscopic analysis are made and the results are shown in Table 4.

Except for using the core prepared as above, a core shell quantum dot is prepared in the same manner set forth in Example 1-2.

With respect to the obtained core-shell quantum dots, a UV-vis spectroscopic analysis and photoluminescence spectroscopic analysis are made and the results are shown in Table 4.

TABLE 4

| OA:HDA (mole ratio) | Te/Se (mole ratio) | Core particle (PL excitation at 372 nm) | | | Core-shell QD (PL excitation at 372 nm) | | |
| --- | --- | --- | --- | --- | --- | --- | --- |
|  |  | PL maximum peak wavelength (nm) | FWHM (nm) | QE (%) | PL maximum peak wavelength (nm) | FWHM (nm) | QE (%) |
| 2:1 | 1/30 | 435 | 58 | 36 | 448 | 33 | 64 |
| 3:2 | 1/36 | 431 | 52 | 39 | 445 | 28 | 72 |
| 2:2 | 1/36 | 446 | 106 | 20 | 447 | 36 | 89 |
| 3:3 | 1/36 | 433 | 108 | 16 | 447 | 33 | 84 |
| 2:3 | 1/36 | 455 | 94 | 11 | 446 | 32 | 82 |
| 1:2 | 1/30 | 477 | 144 | 2 | 454 | 42 | 73 |
| 1:4 | 1/36 | 592 | 74 | 1 | 457 | 52 | 51 |
| 0:5 | 1/36 | Zn metal formation (impossible to obtain a core particle) | | | — | — | — |

The results of the UV-vis spectroscopic analysis confirm that the core shell QD as prepared do not show a $1^{st}$ peak in the UV-vis absorption spectrum. The results of Table 2 confirm that the core-shell QDs prepared in the Example 2-2 has a narrower FWHM and a higher level of QE in comparison with the core-shell QDs prepared in the Comparative Examples.

The results of Table 2 confirm that in Comparative Examples, the quantum dots including the core prepared without the amide ligand exhibit a significantly lower level of the QE in comparison with that of the core-shell QD of the Example.

The results of Table 4 confirm that when the ligand mixture does not include a relatively excess amount of the amide ligand at the time of forming the core, the core-shell quantum dot as prepared exhibit relatively poor luminous properties (e.g., a wider FWHM and a lower QE).

Example 4

A core particle is prepared in the same manner as set forth in Example 2-1 except that oleylamine is used instead of hexadecyl amine and 1.5 mole of the oleic acid and 1 mole of the oleylamine are used with respect to 1 mole of the zinc precursor, respectively.

Figure 13:
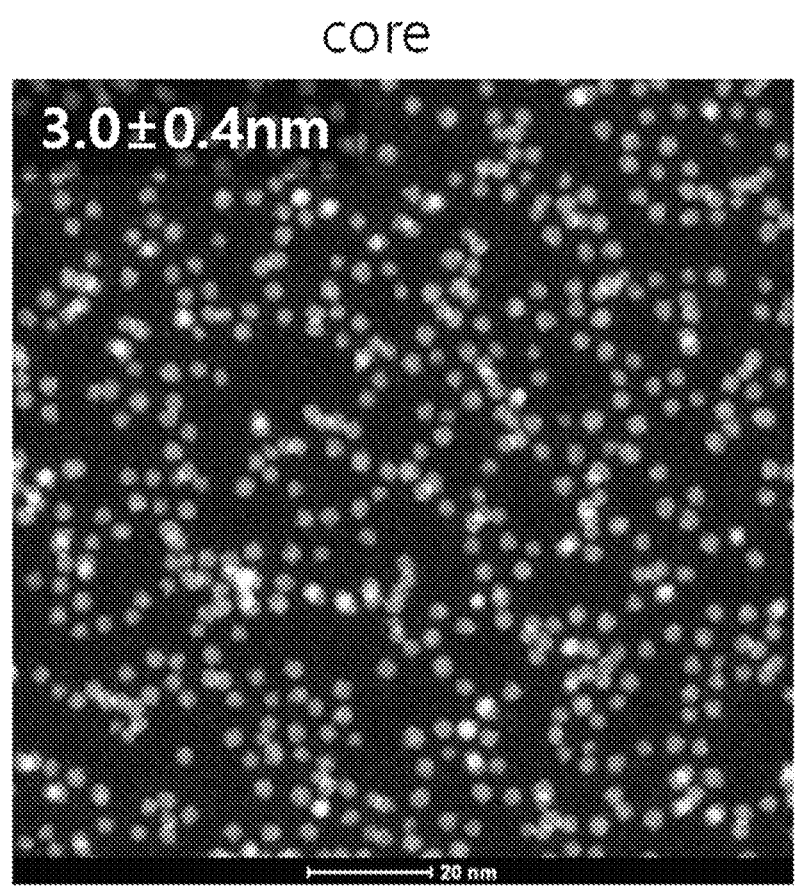
FIG. 13 shows a transmission electron microscope (TEM) image of the ZnTeSe cores produced in Example 4-1.

A transmission electron microscopic analysis is made for the core particles and the results are shown in FIG. 13. The results confirm that the obtained core particles have relatively uniform particle sizes and their shapes are generally spherical. With respect to the obtained core particles, a UV-vis spectroscopic analysis and photoluminescence spectroscopic analysis are made and the results are shown in Table 5.

Except for using the core prepared as above, a core shell quantum dot is prepared in the same manner set forth in Example 1-2.

With respect to the obtained core-shell quantum dots, a UV-vis spectroscopic analysis and photoluminescence spectroscopic analysis are made and the results are shown in Table 5.

Figure 14:
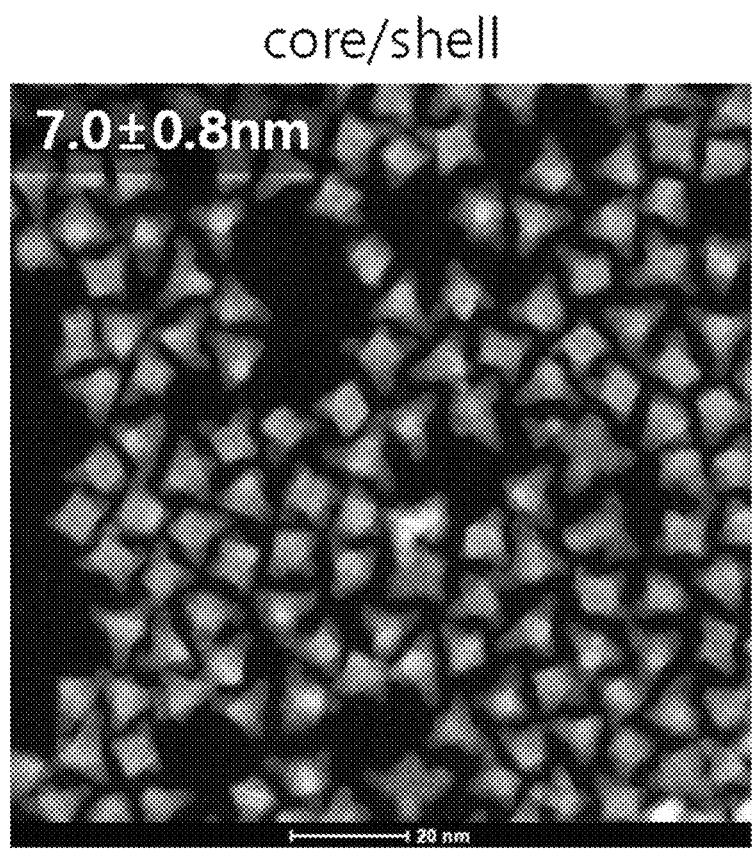
FIG. 14 shows a TEM image of the core-shell quantum dot produced in Example 4-2.

With respect to the core-shell quantum dot particles, a transmission electron microscopic analysis is made and the results are shown in FIG. 14. The results of FIG. 14 confirm that the obtained quantum dots have multipod shapes.

With respect to the obtained core-shell particles, a UV-vis spectroscopic analysis and photoluminescence spectroscopic analysis are made and the results are shown in Table 5.

TABLE 5

| | Photoluminescence (excitation at 372 nm) | | Quantum efficiency (QE) |
|---|---|---|---|
| | Maximum PL peak wavelength (nm) | FWHM (nm) | |
| Core particle | 443 | 77 | 12% |
| Core-shell QD | 445 | 31 | 83% |

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. Quantum dots, each comprising:
a core comprising zinc, tellurium, and selenium; and
a shell disposed on at least a portion of the core and comprising zinc; and selenium and optionally sulfur,
wherein the quantum dots do not comprise cadmium,
wherein the quantum dots comprise a mole ratio of tellurium with respect to selenium of greater than or equal to about 0.001,
wherein in the quantum dots, a mole amount of selenium is greater than a mole amount of tellurium,
wherein a maximum luminescent emission peak of the quantum dots is in a wavelength range from about 440 nanometers to about 560 nanometers,
wherein a quantum efficiency of the quantum dots is greater than or equal to about 60% and less than or equal to 100%, and
wherein a full width at half maximum of the quantum dots is less than or equal to about 45 nm.

2. The quantum dots of claim 1, wherein the maximum luminescent emission peak of the quantum dots is in a wavelength range from about 455 nanometers to about 530 nanometers.

3. The quantum dots of claim 1, wherein the maximum luminescent emission peak of the quantum dots is in a wavelength range of greater than or equal to about 450 nanometers and less than or equal to about 470 nanometers, and
wherein the quantum dots comprise a mole ratio of tellurium with respect to selenium of greater than or equal to about 0.001 and less than about 0.03.

4. The quantum dots of claim 1, wherein the maximum luminescent emission peak of the quantum dots is in a wavelength range from about 500 nanometers to about 540 nanometers.

5. The quantum dots of claim 1, wherein the shell comprises zinc, selenium, and sulfur.

6. The quantum dots of claim 1, wherein in the quantum dot, a mole ratio of a sum of S and Se with respect to Zn is greater than or equal to about 0.3 and less than or equal to about 1.

7. The quantum dots of claim 1, wherein the quantum dot further comprises an organic ligand and the organic ligand comprises RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR, $RPO(OH)_2$, RHPOOH, RHPOOH, or a combination thereof, wherein R is the same or different and independently is a $C_1$ to $C_{40}$ aliphatic hydrocarbon group, a $C_6$ to $C_{40}$ aromatic hydrocarbon group, or a combination thereof.

8. The quantum dots of claim 1, wherein the maximum luminescent emission peak of the quantum dot has a full width at half maximum of less than or equal to about 40 nanometers.

9. The quantum dots of claim 1, wherein the quantum efficiency of the quantum dots is from about 70% to about 99%.

10. The quantum dots of claim 1, wherein the quantum efficiency of the quantum dots is from about 80% to about 95%.

11. The quantum dots of claim 1, wherein an average size of the quantum dots is greater than or equal to about 4 nanometers and less than or equal to about 50 nanometers.

12. An electroluminescent device, which comprises an anode and a cathode; and an emission layer disposed between the anode and the cathode, the emission layer comprising the quantum dots of claim 1.

13. The electroluminescent device of claim 12, further comprising a charge auxiliary layer between the anode and the cathode.

14. An electronic device comprising core-shell quantum dots,
wherein the core-shell quantum dots comprise zinc, selenium, tellurium, and sulfur;
wherein the core shell quantum dots do not comprise cadmium,
wherein in the core shell quantum dots, a mole ratio of the tellurium with respect to the zinc is greater than or equal to about 0.001,
wherein in the core shell quantum dots, a mole ratio of the tellurium with respect to the selenium is greater than or equal to about 0.001,
wherein in the core shell quantum dot, a mole amount of the zinc is greater than a mole amount of the selenium, and a mole amount of the selenium is greater than or equal to about a mole amount of the tellurium,
wherein a maximum luminescent emission peak of the quantum dot is in a wavelength range from about 440 nanometers to about 560 nanometers, and
wherein a quantum efficiency of the core shell quantum dots is greater than or equal to about 60%, or
wherein a full width at half maximum of the core shell quantum dots is less than or equal to about 38 nm.

15. The electronic device of claim 14, wherein the full width at half maximum of the core shell quantum dots is from about 28 nm to about 37 nm; or wherein a quantum efficiency of the core shell quantum dots is greater than or equal to about 70% and less than or equal to 99%.

16. The electronic device of claim 14, wherein the core shell quantum dots comprise a core comprising zinc, selenium, and tellurium, and a shell disposed on the core and comprising zinc, selenium and sulfur.

17. The electronic device of claim 14, wherein the core shell quantum dots comprises a mole ratio of sulfur to zinc of greater than or equal to about 0.1.

18. The electronic device of claim 14, wherein the core shell quantum dots comprises a mole ratio of sulfur and selenium to zinc of greater than or equal to about 0.3 and less than or equal to about 1.

19. The electronic device of claim 14, further comprising an anode and a cathode facing each other; and a layer disposed between the anode and the cathode, wherein the core shell quantum dots are included in the layer.

\* \* \* \* \*